(12) United States Patent
Xie et al.

(10) Patent No.: US 12,148,714 B2
(45) Date of Patent: Nov. 19, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Wei Xie, Wuhan (CN); Di Wang, Wuhan (CN); Tingting Zhao, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 481 days.

(21) Appl. No.: 17/488,846

(22) Filed: Sep. 29, 2021

(65) Prior Publication Data
US 2023/0084615 A1    Mar. 16, 2023

Related U.S. Application Data

(63) Continuation of application No. PCT/CN2021/117882, filed on Sep. 13, 2021.

(51) Int. Cl.
*H10B 43/27*   (2023.01)
*H01L 23/00*   (2006.01)
*H01L 23/522*  (2006.01)
*H01L 23/528*  (2006.01)
*H10B 41/27*   (2023.01)

(52) U.S. Cl.
CPC ........ *H01L 23/562* (2013.01); *H01L 23/5226* (2013.01); *H01L 23/5283* (2013.01); *H10B 41/27* (2023.02); *H10B 43/27* (2023.02)

(58) Field of Classification Search
CPC ....... H01L 23/562; H10B 43/50; H10B 41/27; H10B 43/27
See application file for complete search history.

(56) References Cited

U.S. PATENT DOCUMENTS

| 10,141,331 | B1  | 11/2018 | Susuki et al. |           |
|------------|-----|---------|---------------|-----------|
| 2018/0277556 | A1* | 9/2018 | Kang ............... | H10B 43/10 |
| 2018/0301374 | A1  | 10/2018 | Masamori et al. |         |
| 2020/0152585 | A1* | 5/2020 | Eom ................ | H10B 43/27 |
| 2020/0203366 | A1* | 6/2020 | Kim ................ | H10B 41/50 |
| 2021/0249434 | A1* | 8/2021 | Nishikawa ........ | H10B 43/35 |

FOREIGN PATENT DOCUMENTS

| CN | 111602244 A | 8/2020 |
| CN | 112272868 A | 1/2021 |

OTHER PUBLICATIONS

International Search Report issued in corresponding International Application No. PCT/CN2021/117882, mailed Jun. 20, 2022, 4 pages.

* cited by examiner

*Primary Examiner* — Evan G Clinton
(74) *Attorney, Agent, or Firm* — BAYES PLLC

(57) ABSTRACT

Three-dimensional (3D) memory devices and methods for forming the same are disclosed. In certain aspects, a 3D memory device includes a stack structure containing a core region and a staircase region, a channel structure extending through the stack structure in the core region, and a first support structure extending through the stack structure in the staircase region. The first support structure includes a first portion extending along a first direction and a second portion protruding from the first portion along a second direction perpendicular to the first direction.

17 Claims, 24 Drawing Sheets

THREE-DIMENSIONAL MEMORY DEVICES AND METHODS FOR FORMING THE SAME

CROSS-REFERENCE TO RELATED APPLICATIONS

This application is continuation of International Application No. PCT/CN2021/117882, filed on Sep. 13, 2021, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY 3D memory devices and fabrication methods thereof are disclosed herein.

In one aspect, a 3D memory device includes a stack structure containing a core region and a staircase region, a channel structure extending through the stack structure in the core region, and a first support structure extending through the stack structure in the staircase region. The first support structure includes a first portion extending along a first direction and a second portion protruding from the first portion along a second direction perpendicular to the first direction.

In another aspect, a 3D memory device includes a stack structure including a core region and a staircase region, a channel structure extending through the stack structure in the core region, and a first support structure extending through the stack structure in the staircase region. The first support structure has a bead-embedded strip shape in a plan view.

In another aspect, a method for forming a three-dimensional (3D) memory device includes forming a stack structure, the stack structure comprising a core region and a staircase region, forming a channel structure extending through the stack structure in the core region, and forming a first support structure extending through the stack structure in the staircase region. The first support structure has a bead-embedded strip shape in a plan view.

In still another aspect, a system includes a 3D memory device configured to store data and a memory controller coupled to the 3D memory device and configured to control the 3D memory device. The 3D memory device includes a stack structure comprising a core region and a staircase region, a channel extending through the stack structure in the core region, and a first support structure extending through the stack structure in the staircase region. The first support structure has a bead-embedded strip shape in a plan view.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
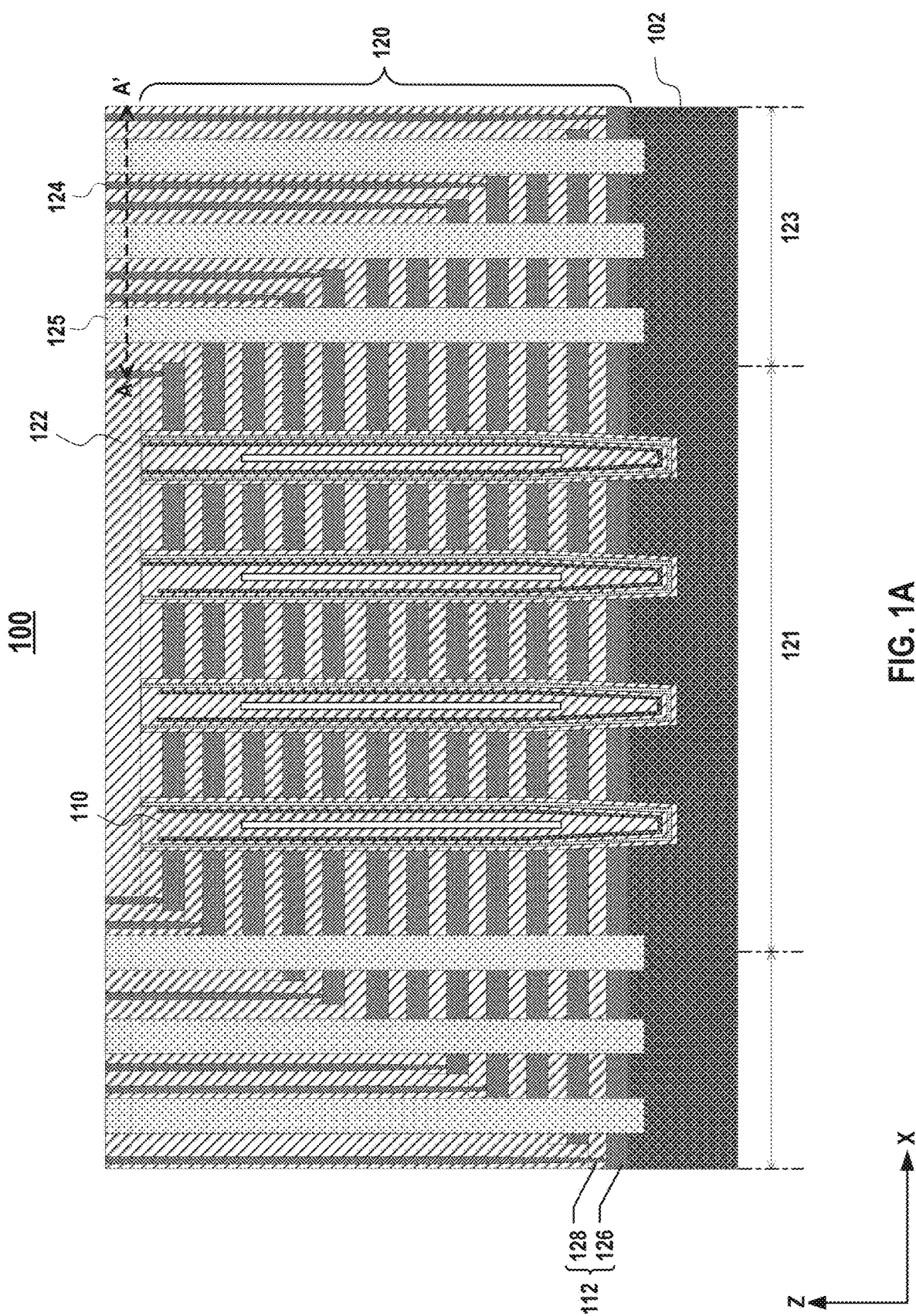
FIG. 1A illustrates a side view of a cross-section of an exemplary 3D memory device, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent or entirety of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

NAND flash memory devices, widely used in various electronic products, are non-volatile, light-weighted, of low power consumption, and have good performance. Currently, planar NAND flash memory devices have reached their storage limit. To further increase the storage capacity and reduce the storage cost per bit, 3D NAND memory devices have been proposed. As shown in FIG. 1A, 3D NAND memory device 100 may include a substrate 102, a stack structure 120 over substrate 102, and an outer insulating layer 122 over stack structure 120 such that stack structure 120 is located inside the outer insulating layer. Stack structure 120 may include a plurality of conductive layers 126 and a plurality of dielectric layers 128 interleaved with each other, forming a plurality of conductor/dielectric layer pairs. 3D memory device 100 may include a core region 121 and one or more staircase regions 123 (3D NAND memory device 100 shows two staircase regions) neighboring the core region. In core region 121, 3D memory device 100 may include a plurality of channel structures 110 extending through stack structure 120 into substrate 102 along a vertical direction as illustrated in FIG. 1A. In staircase region 123, stack structure 120 may include a staircase having a plurality of stairs 112 extending laterally in a planar direction. 3D memory device 100 may include a plurality of contact plugs 124 extending in outer insulating layer 122 and each landed on a respective stair 112 and in contact with a respective conductive layer 126. In some implementations, 3D memory device 100 may also include a plurality of gate line slits (GLSs) (not shown in the figure) formed in staircase region 123.

In a 3D NAND memory device, the number of the conductor/dielectric layer pairs 112 in stack structure 120 determines the number of memory cells in 3D memory device 100. As the number of conductor/dielectric layer pairs 112 increases for higher storage, more stress is introduced into the 3D NAND memory device due to the weight and distribution of the conductive layers, causing existing supporting structures to deform, e.g., bending. Sometimes, even the channel structures 110 are deformed due to the stress. To reduce the stress in the conductive layers, support structures, such as dummy channel structures, may be formed in a 3D NAND memory device. For example, a certain number of support structures 125 may be formed in staircase region 123 of the 3D NAND memory device 100, to balance the mechanical stress in conductive layers 126, as well as the mechanical load/stress between staircase regions 123 and core region 121.

However, in an existing 3D NAND memory device, due to the space occupied by gate lines slits (GLSs) and contact plugs in a staircase region, a density of the support structures, e.g., the number of support structures in a unit area, may be limited and thus is not sufficiently high to provide desirable support to the conductive layers. As a result, the conductive layers are still susceptible to bending, and the support structures can shift laterally, especially in the lateral direction in which the stairs in the staircase region extend. The support structures can undesirably deviate from their purported locations. Consequentially, the deviation/shift in the lateral plane can cause the support structures to overlap with the openings that are formed in an outer insulating layer for forming the contact plugs. That is, at least some openings may fully or partially be landed on the support structures. Because the outer insulating layer and the support structures may include similar or the same material(s), the conductive layers, functioning as an etch-stop layer for the openings, may not stop the etching of the openings in the overlapping areas. As a result, the support structures can be etched. The damages to the support structures can impair the stress balancing. When a conductive material is deposited to fill the openings for forming the contact plugs, a short circuit can also occur.

Figure 1B:
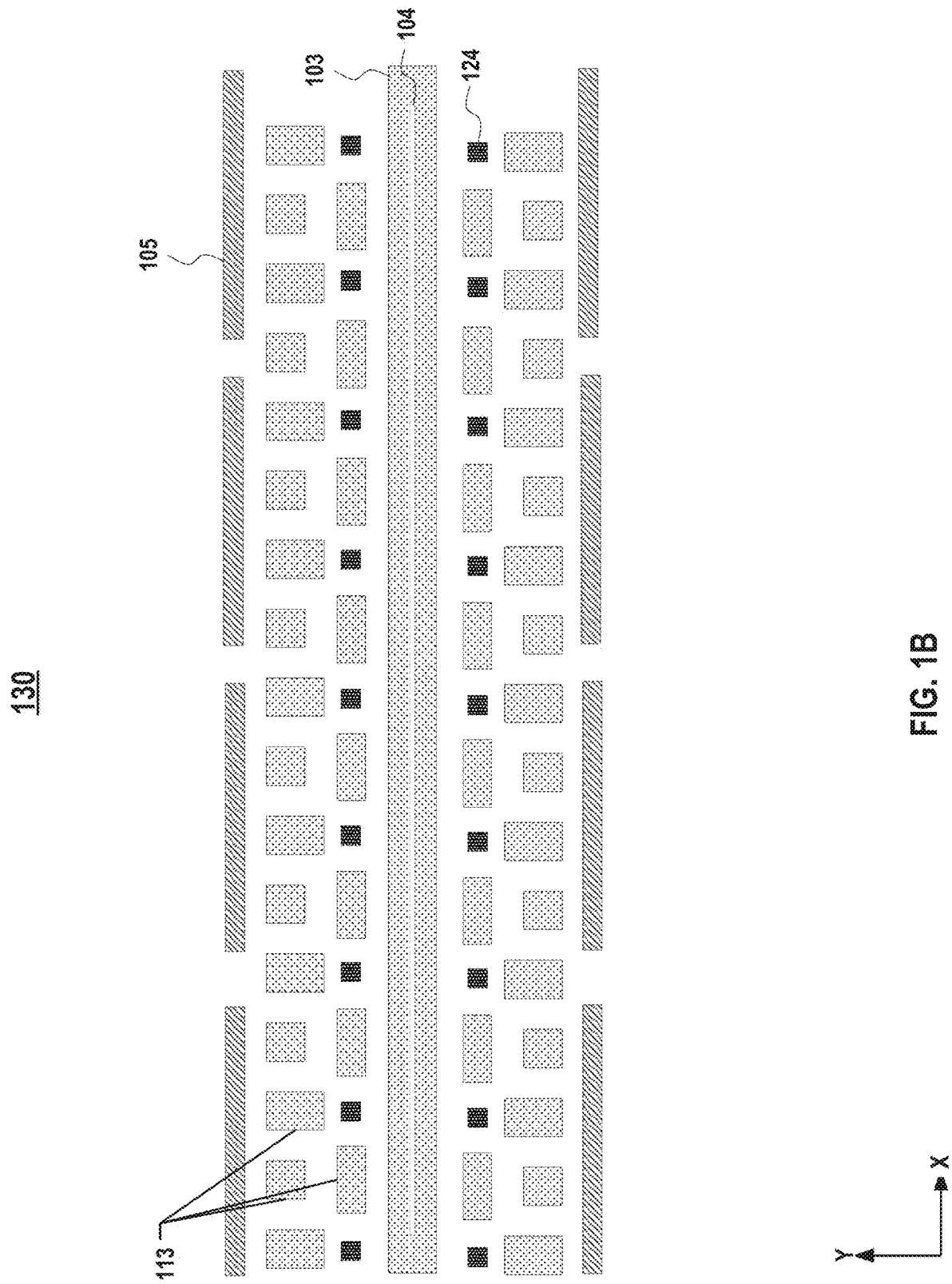
FIG. 1B illustrates a top view of a cross-section of a staircase region of an exemplary 3D memory device including a strip shape support structure, according to some implementations of the present disclosure.

In some implementations, elongated strip shape support structures may be then included in a staircase region of 3D memory device 100, to provide improved support to the conductive layers of 3D memory device 100. FIG. 1B illustrates a top view 130 of a cross-sectional of a staircase region 123 along an A-A' direction, according to some implementations. For ease of illustration, A-A' direction is also shown in FIG. 1A as an example. It should be understood that FIG. 1B is merely intended to show the structures of support structures, contact plugs, and GLSs in the present disclosure and is not meant to limit the number and the exact locations of these structures. As shown in FIG. 1B, a staircase region of 3D NAND memory device 100 includes support structures 113/103, contact plugs 124, and GLSs 105. The cross-section shows a lateral plane of the support structures 113/103, contact plugs 124, and GLSs 105. The lateral plane is defined by two lateral directions, i.e., x-direction (the direction in which the stairs in the staircase region extend) and y-direction (the other lateral direction perpendicular to the x-direction). The vertical direction (i.e., z-direction) is perpendicular to the lateral plane and thus perpendicular to both the x-direction and the y-direction. The same notion for describing spatial relationships is applied throughout the present disclosure unless specified otherwise.

In 3D NAND memory device 100, contact plugs 124 are in contact with the conductive layers so that electrical signals are provided to or transferred out of a semiconductor structure through formed contact plugs. As illustrated in FIG. 1B, each contact plug 124 is surrounded from different sides by support structures 113/103, which support the semiconductor structure and prevent the bending of the conductive layers in an area close to that contact plug 124, when external forces are exerted over a tolerable level. As illustrated in FIG. 1B, support structures 113/103 may include a first support structure 103 and a set of second support structures 113. First support structure 103 may be a strip shape support structure that has an elongated strip shape extending along a first direction (e.g., x-direction). The first support structure may thus be referred to as strip shape support structure 103. Second support structures 113 may include a plurality of support structures in block shapes. Here, the block shapes may mean a square, rectangular, L-shape, pentagon, hexagon, diamond, etc. As shown in FIG. 1B, these block shapes may be the same or different in shape and size, even within a same staircase region 123. In some implementations, due to the diffraction, process effects, or other reasons commonly accompanying photolithography on a nano-meter level, the exact shapes of block shape support structures 113 in a fabricated 3D NAND memory device may be rounder, e.g., close to a circle, ellipse and the like, but not in the exact angular shapes as described above. For first support structure 103, a slit in a designed pattern used in the photolithography for forming the strip shape support structure may extend laterally along the word line direction in a straight-line pattern in the plan view (parallel to the wafer plane). Accordingly, first support structure 103 may extend along the word line in the staircase region. In some implementations, by including multiple strip shape support structures 103, a 3D NAND memory device may be also divided into different memory regions, e.g., different memory fingers or blocks, by these strip shape support structures. That is, besides providing support for the conductive layers, the strip shape support structures 103 may also divide a 3D NAND memory device into a plurality of blocks and/or fingers, as further described more in detail in FIG. 4B.

In some implementations, the fabrication process for forming first support structure 103 may include lithography, etching a trench in stack structure 120 and outer insulating layer 122, depositing insulation material into the trench, and chemical mechanical polishing (CMP). Due to the nature of insulation deposition in a narrow trench by chemical vapor deposition (CVD), seams and voids are very likely formed after chemical vapor deposition. For instance, an elongated seam 104 may be formed inside first support structure 103 after chemical vapor deposition, as shown in FIG. 1B. In some implementations, the as-formed elongated seam 104 may cause first support structure 103 to crack due to certain stress (e.g., thermal stress) placed on the formed seam. For instance, the as-formed elongated seam 104 may cause first support structure 103 to crack in a subsequent gate line annealing process, a heat treatment process for removing hydrogen or other residues after the formation of conductive layers in the fabrication of a 3D NAND memory device. A cracked support structure may cause degradation, or even loss, of the support provided by first support structure 103 to the semiconductor structure.

Figure 1C:
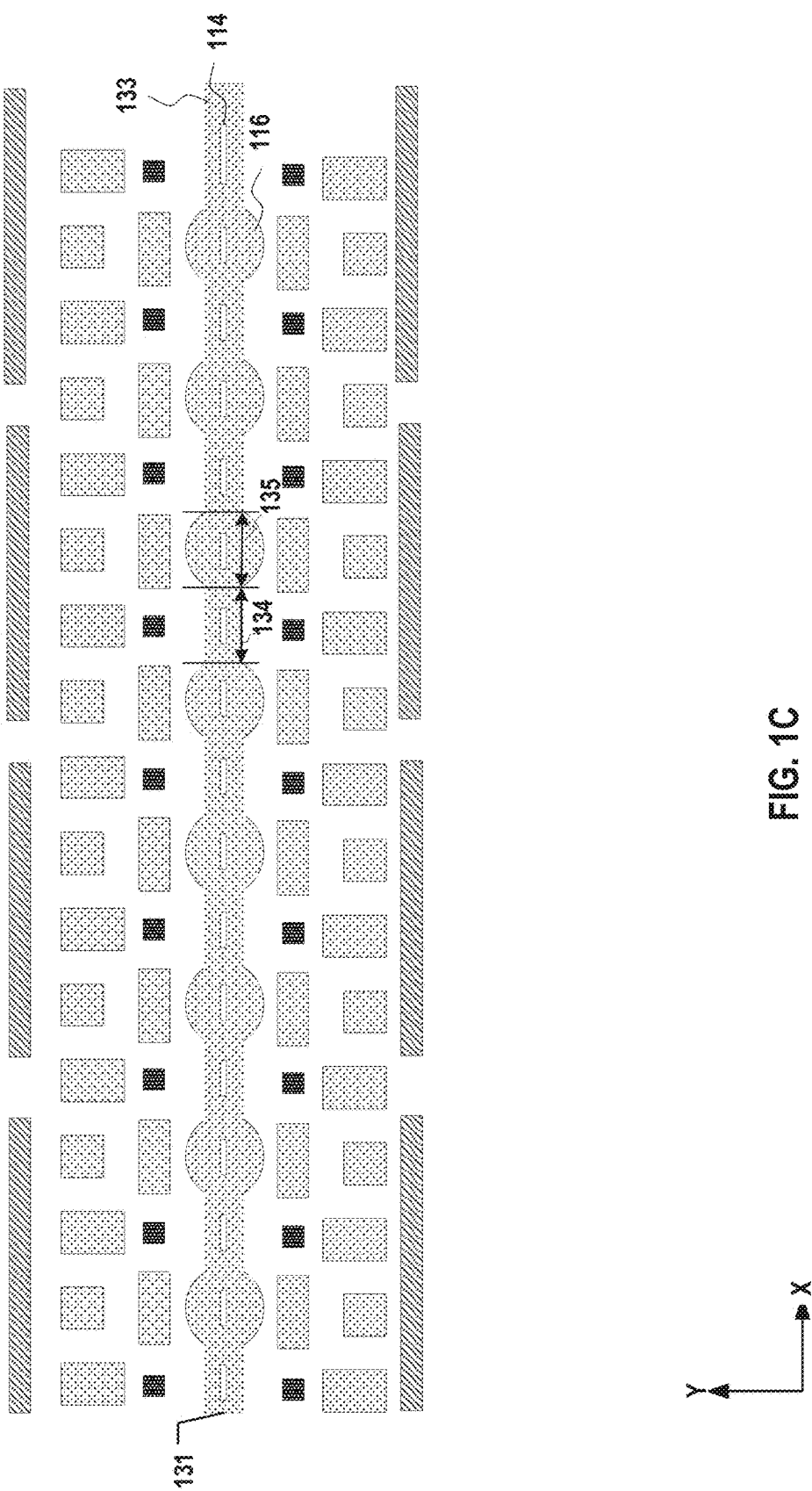
FIG. 1C illustrates a top view of a cross-section of a staircase region of an exemplary 3D memory device including a bead-embedded strip shape support structure, according to some implementations of the present disclosure.

In some implementations, to prevent the formation of crack(s) of the first support structure caused by the stress placed on the formed seam 104, the shape of first support structure 103 may be modified to have a shape including a string of beads aligned along the strip shape support structure, according to some implementations of the present disclosure. FIG. 1C illustrates a top view of a cross-section 150 of a staircase region of an exemplary 3D memory device having a bead-embedded strip shape support structure, according to some implementations of the present disclosure. As illustrated in the figure, instead of including merely an elongated strip shape support structure, first support structure 131 included in the staircase region of a 3D NAND memory device includes two different portions. The first portion 133 may include an elongated central strip shape portion extending along a first direction (e.g., x-direction), similar to first support structure 103 shown in FIG. 1B. The second portion may include a plurality of curved portions 116 protruding from two opposite sides of the elongated central strip shape portion. These curved portions 116 may be aligned along first portion 133 pair-by-pair, and each pair may look like a "bead" as a whole, as shown in FIG. 1B. To differ it from first support structure 103 shown in FIG. 1B, first support structure 131 shown in FIG. 1C may be also referred to as "bead-embedded strip shape support structure," where each pair of curved portions, together with the respective central strip section, may be referred to as a "bead". In some implementations, curved portions 116 may extend to a different extent along a second direction (e.g., y-direction). Accordingly, the referred beads in a bead-embedded strip shape support structure may be in the shape of a circle, different shapes of ellipses, etc.

In some implementations, to form such a bead-embedded strip shape support structure, a designed pattern used in the photolithography process may be modified to include a string of beads for forming the bead-embedded strip shape support structures. Accordingly, when etching an elongated trench in the outer insulating layer and the stack structure for forming a strip shape support structure, the etched trench may also include curved portions on two opposite sides along the elongated trench. For ease of interpretation, sections 135 of first support structure 131 with the curved portions may be referred to as "curved sections" hereinafter, as shown in FIG. 1C. These curved sections have more room for a gas deposition process when compared to sections 134 without curved portions (which may be referred to as "narrow sections" hereinafter) of first support structure 131. Accordingly, during the deposition process, there will be more gas entering the curved sections due to the more open space in these sections. In some implementations, the gas filling the curved sections will also enter into the narrow sections from two sides of the narrow sections in the x-direction, which then causes more gaseous dielectric materials to enter into and be deposited on the edges of the narrow sections adjacent to the curved sections. Due to the more dielectric materials deposited on the edges of the narrow sections, the possibility of forming the seams in these edges is greatly reduced, thereby preventing the formation of an elongated seam normally formed in a strip shape support structure shown in FIG. 1B. Instead, shorter pieces of seams are formed inside bead-embedded strip structure 131, as shown in FIG. 1C, which includes multiple short seams 114. Here, a seam means a narrow opening formed inside and/or on the surface of a structure (e.g., a strip shape support structure) along a certain direction (e.g., x-direction in the formed seam 104 or 114) after condensation of certain materials due to an evaporation process. It should be understood that a formed seam, either elongated seam 104 in FIG. 1B or short seam 114 in FIG. 1C, do not necessarily extend across a whole support structure in the z-direction. In addition, the width of each seam in the y-direction may also vary across a whole support structure in the z-direction. For instance, a formed seam (elongated seam 104 or short seam 114) may be narrower or there is no seam at all at a vertical position close to substrate 102.

In some implementations, by breaking elongated seam 104 into shorter seams 114 caused by the introduction of curved portions 116 along elongated central strip shape portion 133, the risk of crack formation along a bead-embedded strip shape support structure 131 may be greatly reduced, as further described more in detail below in FIGS. 2A-3B.

Figure 2A:
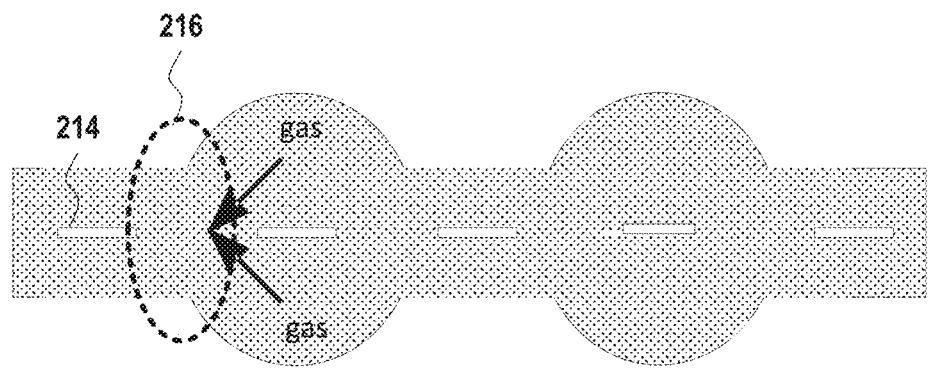
FIG. 2A illustrates a schematic diagram of seam breakage on a bead-embedded strip shape support structure, according to some implementations of the present disclosure.

FIG. 2A illustrates a schematic diagram of seam breakage on a bead-embedded strip shape support structure, according to some implementations of the present disclosure. Unlike the strip shape support structure shown in FIG. 1A, in which an elongated seam is formed within the strip shape support structure after the deposition process, in the bead-embedded strip shape support structure, there are multiple shorter seams 214 formed inside the bead-embedded strip shape support structure, as shown in FIG. 2A. The breakage of the elongated seam into multiple shorter seams is mainly due to the uneven distribution of the dielectronic materials during the deposition process. The uneven distribution of the dielectronic materials is mainly due to the introduction of the curved portions along the elongated central strip shape support structure, which causes the depositing gaseous dielectric materials to flow from the curved sections into the narrow sections, thereby causing more dielectric materials to be deposited in the bottleneck edge areas of the narrow sections (one of such area is indicated by dotted box 216 in FIG. 2A). With more dielectric materials deposited in these edge areas, the possibility of forming the seams in these areas is greatly reduced, and thus the elongated seam that is normally formed in a strip shape support structure without curved portions can be broken into multiple pieces of seams by including curved portions along the strip shape support structure, as shown in FIG. 1B.

In some implementations, when the elongated seam is broken into multiple shorter seams, the stress experienced by each seam may be reduced, and the total stress experienced by a bead-embedded strip shape support structure is thus also reduced, thereby reducing the risk of crack formation during a gate line annealing process or other heating treatment process in the fabrication process of a 3D memory device.

Figure 3A:
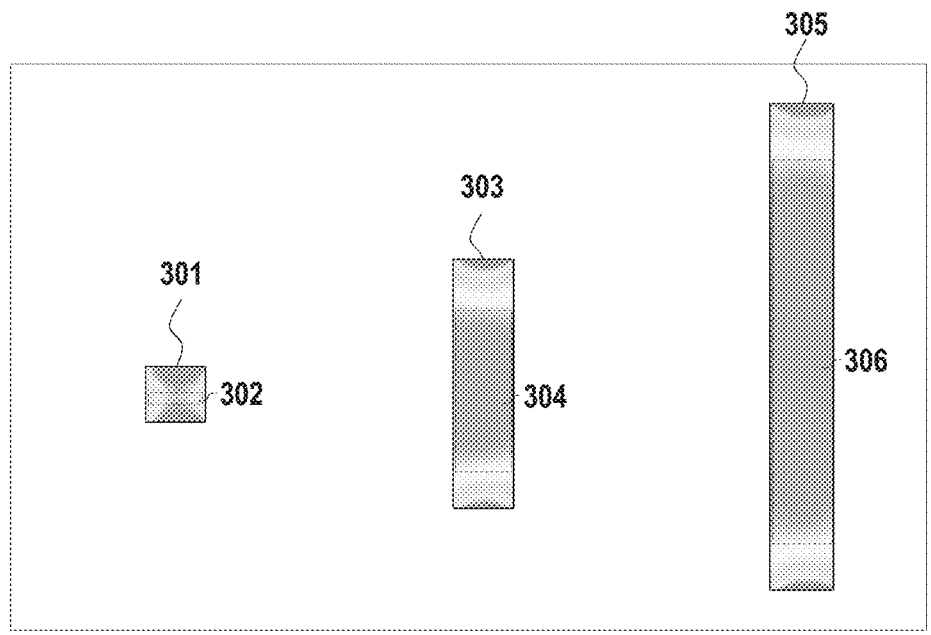
FIG. 3A illustrates simulation results of stress experienced by strip shape support structures with different seam lengths, according to some implementations of the present disclosure.

FIG. 3A illustrates simulation results of stress experienced by strip shape support structures with different lengths. The black boxes 301, 303, and 305 correspond to simulation results of support structures with different lengths if these support structures are incorporated into a 3D NAND memory device. In some implementations, when the length of a strip shape support structure is short, the formed seam length is also short (or even there is no seam formed after the deposition process). That is, the seam length has a positive correlation with the length of a strip shape support structure if the width remains the same. In FIG. 3A, the darkness in the center part (indicated by boxes 302, 304, and 306) of the simulation results indicates the stress experienced by the corresponding support structure, and thus boxes 302, 304, and 306 may be also referred to as stress concentration regions 302, 304, and 306. The larger the stress concentration region, the more the stress experienced by the corresponding support structure. From FIG. 3A, it can be seen that, when the support structure has a short length, as shown in box 301, which actually is a square shape support structure, the formed seam length is also short (or no seam is formed), and there may be no stress experienced by the support structure at all. When the formed seams become longer due to the longer support structures, the stress experienced by the corresponding strip shape support structures is also increased, since the larger stress concentration regions in these boxes 304 and 306. Accordingly, the longer the strip shape support structure, the longer the formed seam, the larger the stress concentration region, and thus the more stress experienced by the corresponding strip shape support structure. From the simulation results shown in FIG. 3A, it can be seen that, by introducing the curved portions along an elongated central strip shape support structure, multiple shorter seams, instead of an elongated seam, are formed, which therefore reduces the stress experienced by a bead-embedded strip shape support structure. The risk of crack formation during a gate line annealing process or other heat treatment process can be then reduced.

In some implementations, the stress experienced by a bead-embedded strip shape support structure may be further decreased by the stress distribution due to Prince Rupert's Drop effect. According to Prince Rupert's Drop theory, large compressive residual stresses in curved sections are distributed to the vicinity of a bead's out surfaces, which causes the stress in the y-direction to be decreased. Due to the distributed residual compressive stresses, the curved portions along the strip shape support structure have a high fracture toughness, and thus the risk of fracture in the bead-embedded strip shape support structure is greatly reduced.

Figure 2B:
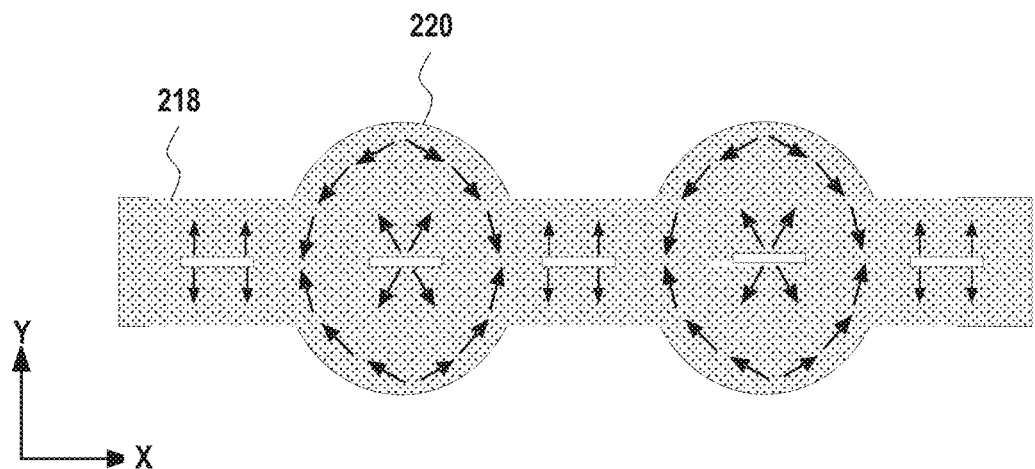
FIG. 2B illustrates a schematic diagram of stress distribution on a bead-embedded strip shape support structure, according to some implementations of the present disclosure.
Figure 2C:
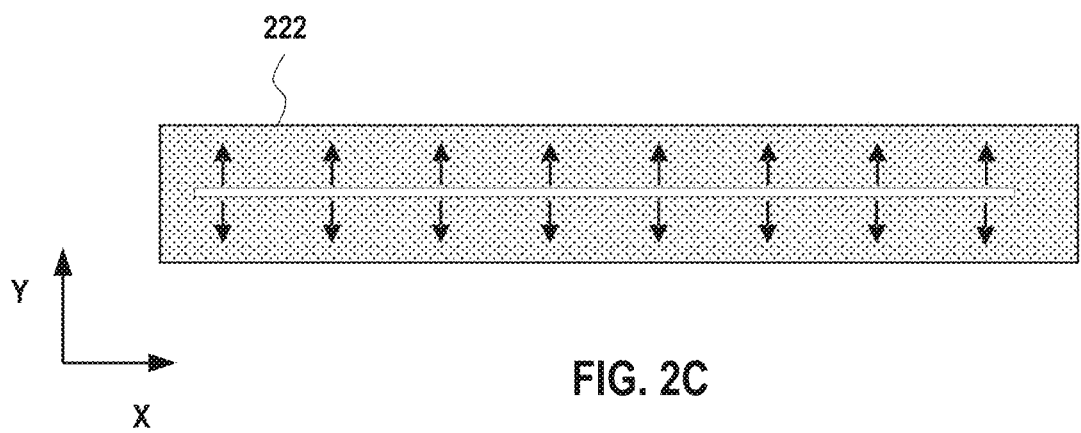
FIG. 2C illustrates a schematic diagram of stress distribution on a strip shape support structure without embedded beads, according to some implementations of the present disclosure.

FIG. 2B illustrates a schematic diagram of stress distribution in a section of a bead-embedded strip shape support structure, according to some implementations of the present disclosure, and FIG. 2C illustrates a schematic diagram of stress distribution in a section of a strip shape support structure without embedded beads, according to some implementations of the present disclosure. As can be seen, in strip shape support structure 218 with embedded beads 220, the stress is distributed to the beads' surface, which then causes the stress in the y-direction of the bead-embedded strip shape support structure to be deceased. In strip shape support structure 222, where there is no embedded bead, the y-direction stress is maintained along the strip shape support structure, and thus the risk of crack formation remains high in the corresponding strip shape support structure.

Figure 3B:
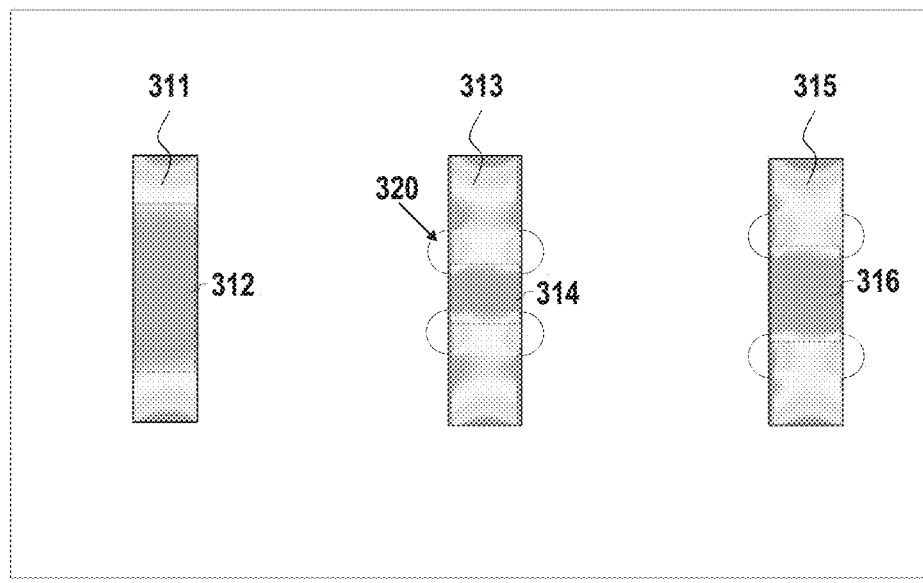
FIG. 3B illustrates simulation results of stress experienced by a strip shape support structure without embedded beads and two bead-embedded strip shape support structures, according to some implementations of the present disclosure.

FIG. 3B further illustrates simulation results of stress experienced by strip shape support structures with or without embedded beads. In the strip shape support structure indicated by box 311, there is no embedded bead, and thus the simulated y-direction stress remains high along the corresponding strip shape support structure, as indicated by the stress concentration region inside the respective inner box 312. In the bead-embedded strip shape support structures indicated by boxes 313 and 315, due to the stress distribution caused by Prince Rupert's Drop effect, the simulated stresses in the y-direction are greatly reduced. As can be also seen from the stress concentration regions in the respective inner boxes 314 and 316 in FIG. 3B, compared to the strip shape support structure indicated by box 315, the strip shape support structure indicated by box 313 has less stress, mainly due to the higher density of the beads 320 embedded along the strip shape support structure. Accordingly, by adjusting the density of the embedded beads, the stress experienced by a bead-embedded support structure can be also modified.

In some implementations, besides the density, the shape and size of the beads may also affect the stress experienced by a bead-embedded strip shape support structure. For instance, within a certain range, by increasing the size of the embedded beads, the stress experienced by a bead-embedded strip shape support structure may be further decreased. For another instance, by changing the curvature of the embedded beads, the stress experienced by a bead-embedded strip shape support structure may be also modified. Certain other parameters related to the beads may be also adjusted. Accordingly, by tuning different parameters of the embedded beads, the stress experienced by a bead-embedded strip shape support structure may be optimized, so as to minimize the risk of the crack formation during the gate line annealing process or other similar processes that may cause the cracks to be formed along a support structure.

In view of the foregoing, the reduced stress experienced by a bead-embedded strip shape support structure can be due to the stress redistribution caused by the structure of the embedded beads as well as the breakage of the elongated seam into multiple short seams. With a reduced risk of crack formation among the corresponding support structures, the performance of the disclosed 3D memory device can be improved.

Figure 4A:
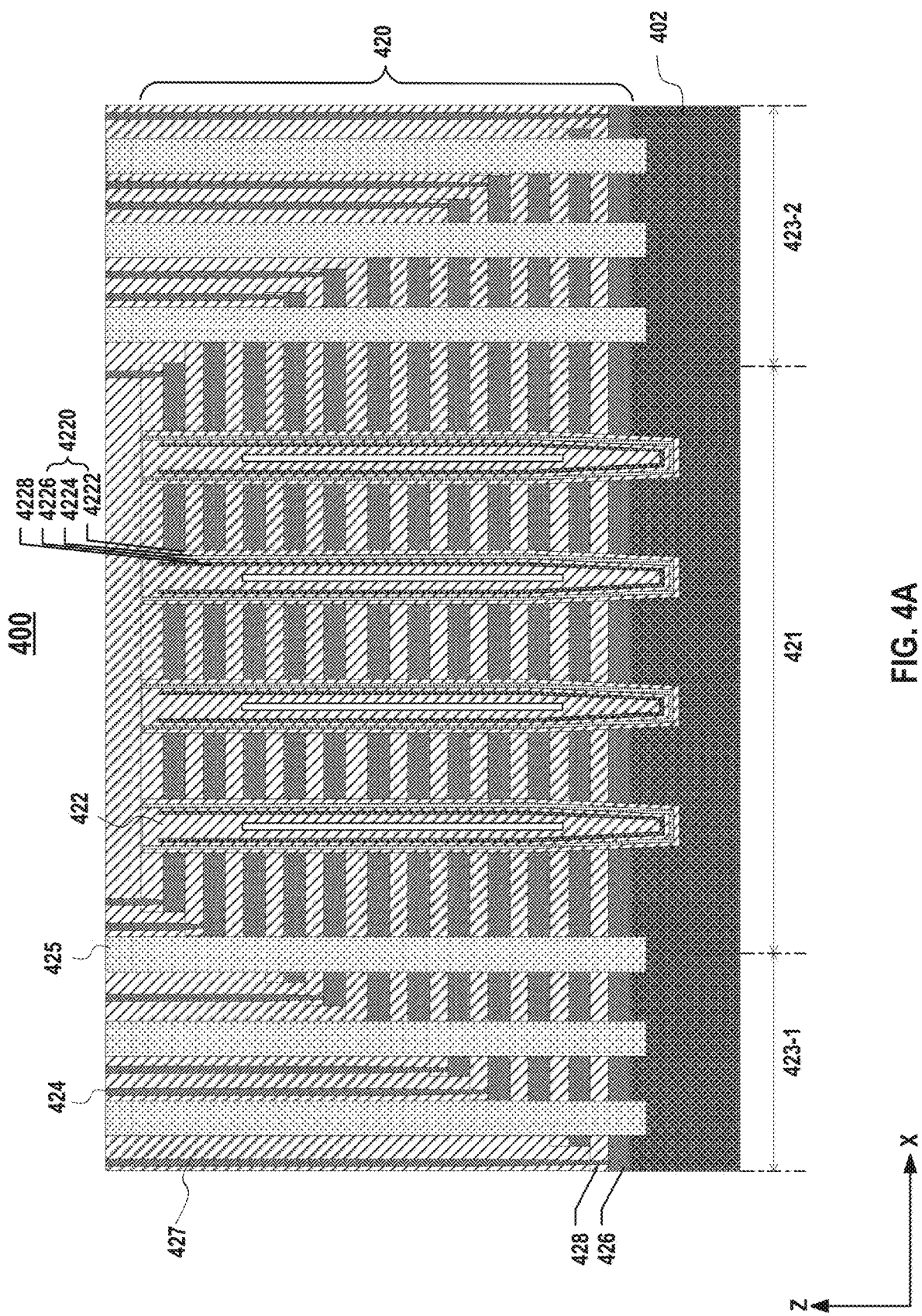
FIG. 4A illustrates a side view of a cross-section of an exemplary 3D memory device, according to some implementations of the present disclosure.

FIG. 4A illustrates a side view of a cross-section of an exemplary 3D memory device 400, according to some aspects of the present disclosure. It should be understood that FIG. 4A shows a 3D memory device 400 during a fabrication process, which may include a substrate 402 and a stack structure 420 laterally formed on substrate 402. Substrate 402 may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 402 is a thinned substrate (e.g., a semiconductor layer), which was thinned by grinding, etching, chemical mechanical polishing (CMP), or any combination thereof. Substrate 402 of 3D memory device 400 may include two lateral surfaces (e.g., a top surface and a bottom surface) extending laterally in the plane defined by the x-direction and the y-direction.

Consistent with the present disclosure, stack structure 420 may include a core region 421 and two staircase regions 423-1 and 423-2 on the two opposite sides adjacent to core region 421. It should be understood that although two staircase regions 423-1 and 423-2 are shown in FIG. 4A, which only illustrates one cross-section of 3D memory device 400, the 3D memory device, according to the present disclosure may include three or more staircase regions surrounding the core region. In addition, in some implementations, a staircase region may be located between two core regions instead.

Figure 4B:
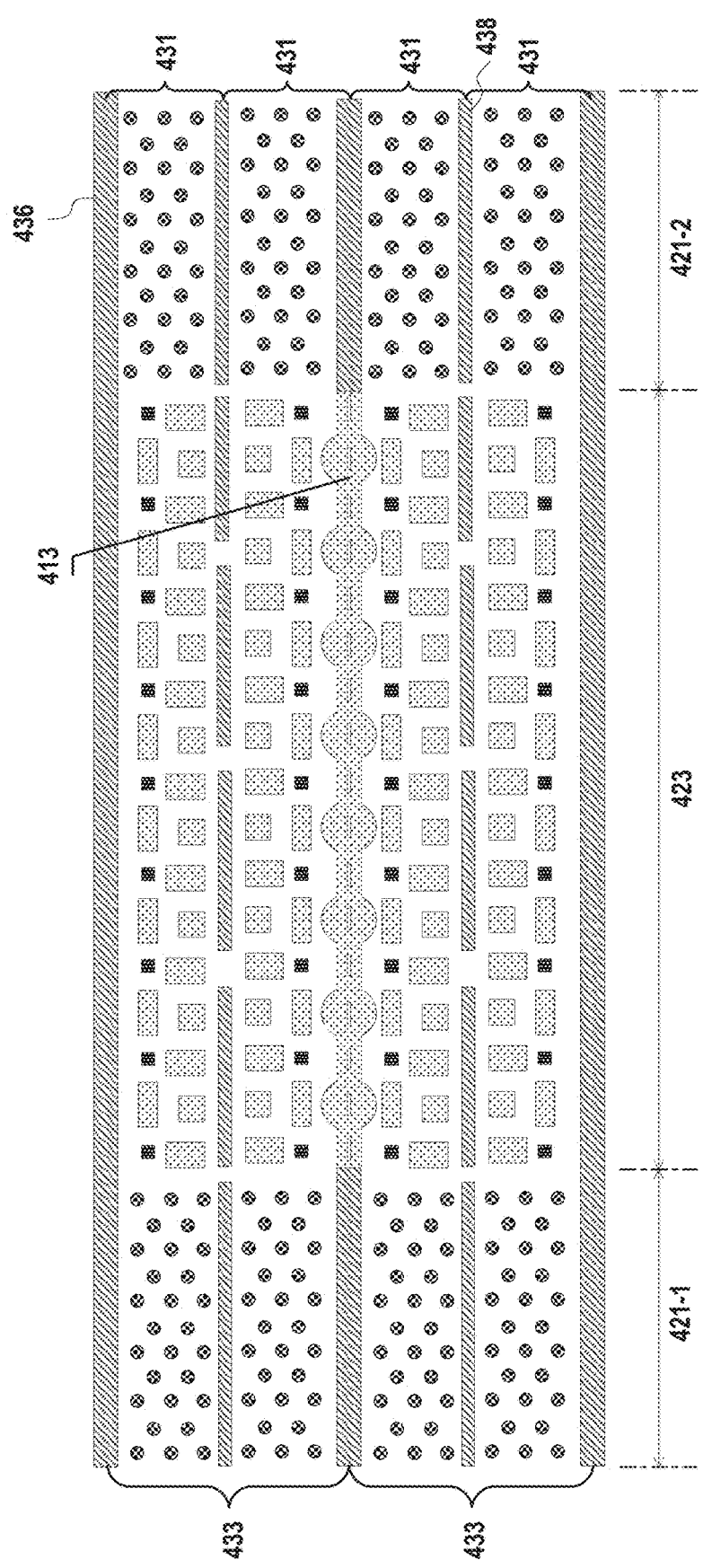
FIG. 4B illustrates a top view of a cross-section of an exemplary 3D memory device, according to some implementations of the present disclosure.

FIG. 4B illustrates a top view of a cross-section of an exemplary 3D memory device 440 that has a staircase region located between two core regions, according to some implementations of the present disclosure. As illustrated, the exemplary 3D memory device 440 may include core regions 421-1 and 421-2 and staircase region 423. Staircase region 423 may be a center staircase region, which equally separates core regions 421-1/421-2 into first and second core regions. For example, first and second core regions 421-1 and 421-2 may be symmetric in the x-direction with respect to the center staircase region 423. It is understood that in some examples, staircase region 423 may be in the intermediate, but not in the middle (center), of core regions 421-1 and 421-2, such that first and second core regions 421-1 and 421-2 may have different sizes. As illustrated in FIG. 4B and as previously described, the staircase region 423 may include contact plugs, support structures, and GLSs. The support structures may include one or more bead-embedded strip shape support structures. For instance, three bead-embedded strip shape support structures 413 may be included in a part of a staircase region, as illustrated in FIG. 4B.

In some implementations, besides providing mechanical support, these bead-embedded strip shape support structures 413 may also separate 3D memory device 440 into different blocks and/or fingers, as previously described. For instance, as shown in FIG. 4B, bead-embedded strip shape support structures 413 in staircase region 423 may separate 3D memory device 440 into different blocks 433, when combined with GLSs 438 in core regions 421-1 and 421-2. In some implementations in which 3D memory device 440 is a NAND Flash memory device, a block 433 is the smallest erasable unit of the NAND Flash memory device. In some implementations, each block 433 can further include multiple fingers (e.g., fingers 431) in the y-direction separated by certain GLSs (e.g., GLSs 438). It should be understood that, while GLSs 438 are illustrated to separate 3D memory device 440 into different fingers in core regions 421-1 and 421-2, in some implementations, one or more bead-embedded strip shape support structures 413 may also extend into or be included in core regions 421-1 and 421-2, to replace GLSs in the core regions to separate 3D memory devices 440 into blocks and/or fingers. That is, GLSs for separating 3D memory device 440 in the core regions may be partially or completely replaced by bead-embedded strip shape support structures 413. In some implementations, GSLs may also extend from core regions 421-1/421-2 into staircase region 423 in separating 3D memory device 440 into different blocks 433. For instance, as illustrated in FIG. 4B, GLSs 436 may continuously extend across core regions 421-1 and 421-2 and staircase region 423 to separate 3D memory device 440 into different blocks 433. When GLSs 436 and bead-embedded strip shape support structures 413 are both employed in separating 3D memory device 440 into blocks 433, GLSs 436 and bead-embedded strip shape support structures 413 may be alternatively aligned between adjacent blocks in staircase region 423, other arrangements for GLSs 436 and bead-embedded strip shape support structures 413 are also possible and contemplated.

Referring back to FIG. 4A, in some implementations, a plurality of channel structures 422 may be further formed in a core region (e.g., core region 421 in FIG. 4A or core regions 421-1 and 421-2 in FIG. 4B), extending vertically through stack structure 420. In some implementations, each channel structure 422 includes a memory film 4220, which in turn includes a tunneling layer 4226, a storage layer 4224 (also known as a "charge trap layer"), and a blocking layer 4222. Channel structure 422 may further include a semiconductor channel 4228, which is formed by filling in semiconductor material(s) in channel structure 422. In some implementations, channel structures 422 have a cylindrical shape, and semiconductor channel 4228 and tunneling layer 4226, storage layer 4224, and blocking layer 4222 of memory film 4220 are arranged radially from the center toward the outer surface of the cylinder in this order. A semiconductor plug (not shown) may be provided in the lower portion of channel structure 422 that is in contact with semiconductor channel 4228 and functions as a channel controlled by a source select gate of channel structure 422.

In some implementations, stack structure 420 may further include a plurality of interleaved conductive layers 426 and dielectric layers 428 stacked vertically in a stepped manner in staircase region 423, as illustrated in FIG. 4A. Interleaved conductive layers 426 and dielectric layers 428 are part of a memory stack (not shown). The number of the pairs of conductive layers 426 and dielectric layers 428 in the memory stack determines the number of memory cells in 3D memory device 400. It is understood that in some implementations, the memory stack may have a multi-deck architecture (not shown), which includes a plurality of memory decks stacked one over another. The numbers of the pairs of conductive layers 426 and dielectric layers 428 in each memory deck may be the same or different.

Conductive layers 426 and dielectric layers 428 in stack structure 420 may alternate in the vertical direction. In other words, except the ones at the top or bottom of the memory stack, each conductive layer 426 may be adjoined by two dielectric layers 428 on both sides, and each dielectric layer 428 may be adjoined by two conductive layers 426 on both sides. Conductive layers 426 and dielectric layers 428 may form multiple steps in staircase region 423. Conductive layers 426 may include conductive materials including, but not limited to, tungsten (W), cobalt (Co), copper (Cu), aluminum (Al), Tantalum (Ta), polysilicon, doped silicon, silicides, or any combination thereof. Each conductive layer 426 may include a gate electrode (gate line) surrounded by an adhesive layer and a gate dielectric layer. The gate electrode of conductive layer 426 may extend laterally as a word line, ending at one or more staircase structures in staircase region 423. Each dielectric layer 428 may include dielectric materials including, but not limited to, silicon oxide, silicon nitride, silicon oxynitride, or any combination thereof. It may function as an insulation layer that separates conductive layers and/or lines from contacting each other, which would otherwise result in a short circuit or malfunction of the semiconductor device. Channel structures 422 may extend through a plurality of pairs each including a conductive layer 426 and a dielectric layer 428 (referred to herein as "conductive/dielectric layer pairs"). The number (e.g., 32, 64, or any other number) of the conductive/dielectric layer pairs in stack structure 420 determines the number of memory cells in 3D memory device 400.

In some implementations, 3D memory device 400 further includes a plurality of contact plugs 424, formed in staircase region 423, that are electrically connected to stack structure 420, as shown in FIG. 4A. Each contact plug 424 may extend vertically through an outer insulating layer 427 covering stacking structure 420 until it reaches and forms a contact with a conductive layer 426 of stack structure 420, therefore being electrically connected to conductive layer 426. The farther away a contact plug 424 is from core region 421 of stack structure 420, the larger depth that contact plug 424 extends vertically through stack structure 420 in order to reach its corresponding conductive layer 426. Contact plugs 424 may include one or more conductive layers, such as a metal layer (e.g., W, Co, Cu, Al, or Ta) or a silicide layer surrounded by an adhesive layer (e.g., TiN). In some implementations, 3D memory device 400 additionally includes a plurality of support structures 425 in the staircase regions. These support structures 425 may have different shapes and sizes, as further described below in FIG. 4C.

Figure 4C:
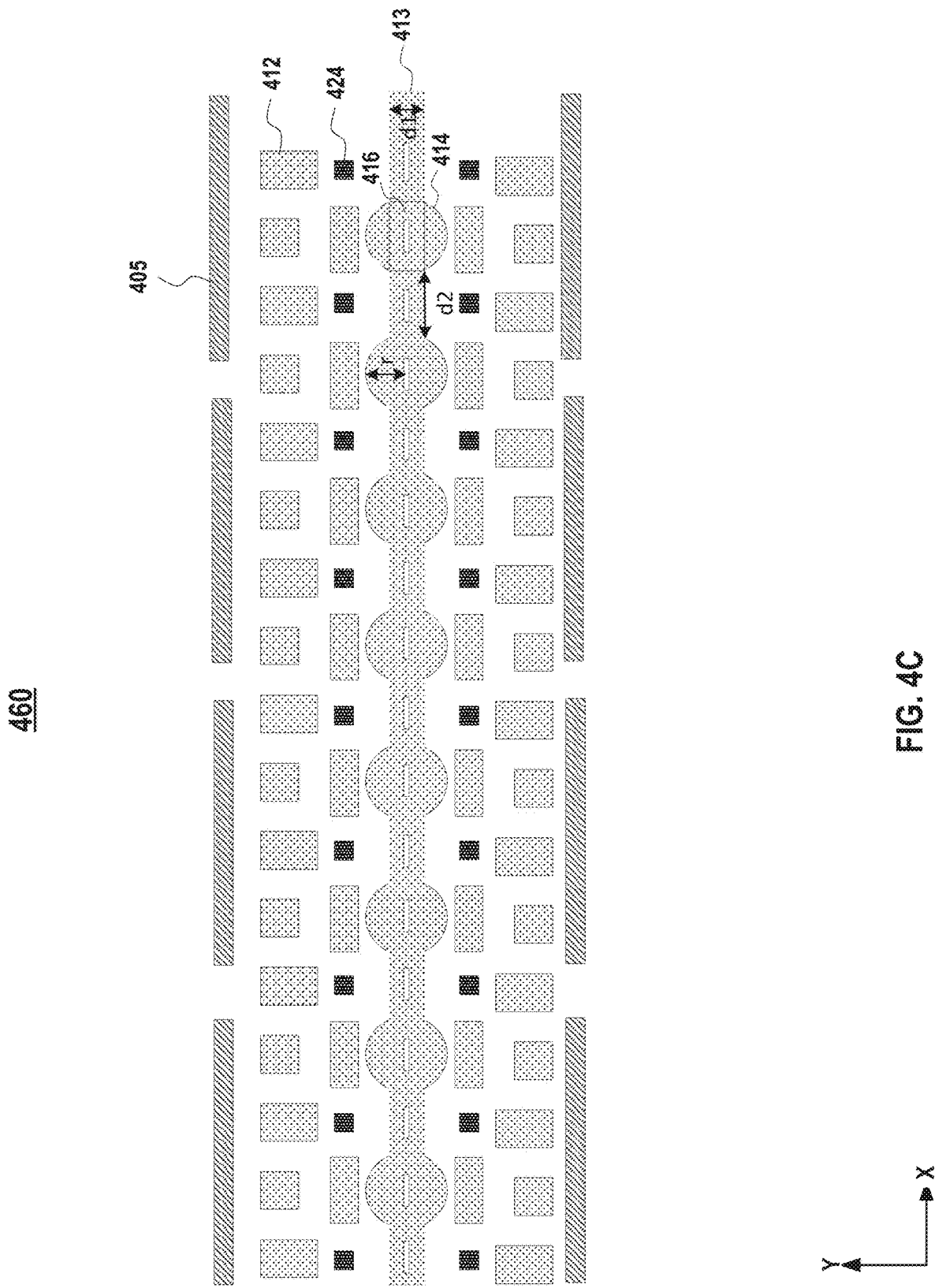
FIG. 4C illustrates a top view of a cross-section of a staircase region of an exemplary 3D memory device, according to some implementations of the present disclosure.

FIG. 4C illustrates a top view 460 of a cross-section of a staircase region of a 3D memory device 400 shown in FIG. 4A/4B, according to some aspects of the present disclosure. As illustrated in the figure, a staircase region includes multiple arrays of contact plugs 424, multiple arrays of block shape (e.g., square or rectangular shape) support structures 412, and multiple bead-embedded strip shape support structures 413 (only one shown in FIG. 4C). Although only one staircase region is used as an exemplary implementation of the present disclosure, it is understood that the same support structure design may be equally applied to other staircase region(s) or even a core region of a 3D memory device, according to the present disclosure. For instance, core region 421 of 3D memory device 400 may include one or more bead-embedded strip shape support structures.

In some implementations, based on a designed pattern for the support structures, each embedded bead 414, including its central strip section 416, may have a circle shape. Alternatively, each curved portion above or below the elongated central strip section may be a half circle. Other shapes of the embedded beads are also possible. For instance, each curved portion above or below the elongated central strip section may be more than half a circle, less than half a circle, or may be a half ellipse, more than a half ellipse, less than a half ellipse, etc. In some implementations, the radius r of the aforementioned circle or ellipse may also vary, and may have a certain ratio with respect to the width $d_1$ of the elongated central strip section. For instance, the radius r of the aforementioned circle or ellipse may be between ¼ of $d_1$ and two times of $d_1$. In addition, the distance $d_2$ between the edges of the adjacent embedded beads may also vary, and may be in a certain range (e.g., between ⅙ of $d_1$ and three times of $d_1$), and may be optimized to a specific value, depending on the shape and size of the embedded beads. In some implementations, the embedded beads along a single strip shape support structure may have the same shape and size. In some implementations, the embedded beads along a single strip shape support structure may have different shapes and sizes. For instance, there may be two types of beams alternatively aligned along a strip shape support structure. In some implementations, two different strip shape support structures in the same or different staircase region may have the same or different types of embedded beads.

In some implementations, a staircase region of 3D memory device 400 may further include a plurality of gate line slits 405. Multiple gate line slits 405 may extend along a first direction (e.g., x-direction) parallelly while being aligned with distances from each other along a second direction (e.g., y-direction) perpendicular to the first direction, as shown in FIG. 4C.

According to the present disclosure, a staircase region of 3D memory device 400, including the contact plugs, support structures, and gate line slits, may be adjusted with various improvements. In some implementations, block shape support structures, created by filling in holes with insulation material, may be arranged in a two-dimensional array, as shown in FIG. 4C. Similarly, contact plugs, created by filling in contact holes with a conductive material, may also be arranged in a two-dimensional array in a top view. Each row of the array of contact plugs may be surrounded by one or more rows of block shape support structure array (e.g., by two adjacent rows of block shape support structures) and by one bead-embedded strip shape support structure, as shown in FIG. 4C. Such an arrangement of support structures and contact plugs may provide structural support across the entirety of the staircase region where such support structures and contact plugs are located. In some implementations, each contact plug 424 is surrounded by three or more block shape support structures 412 from three different sides and by bead-embedded strip shape support structure 413 on a fourth side in staircase region 423, as illustrated in FIG. 4C. This offers an all-around protection of the vertical structure of contact plug 424 against undesired squeezing or bending forces created when stack structure 420 is fabricated to be very high, thus exerting tremendous pressure on the internal components of the 3D memory device. It should be understood that support structures 412 in the array are not limited to the block shape, but can be in many other shapes (e.g., an ellipse, a circle).

In some implementations, the three or more block shape support structures and the bead-embedded strip shape support structure may be equally separated along a circle surrounding a contact plug on a lateral plane of a staircase region. It should be understood that the above should also include the scenario where the three or more block shape support structures and the bead-embedded strip shape support structure are substantially equally separated along the circumference. The term "substantially," when used in describing the separation among the support structures, means the distances between adjacent support structures or angles towards contact plug 424 being surrounded do not vary above a range, such as ±10%. For example, when there are three block shape support structures 412 and one bead-embedded strip shape support structure 413, they may be separated with 90 degrees between each pair of the adjacent support structures. This offers equal protection of the vertical structure of contact plug 424 against forces from all directions. In some implementations, a diameter of the circumference, along which three or more block shape support structures and the bead-embedded strip shape support structure are equally separated, is equal to or less than half of the lateral distance between adjacent contact plugs 424. Therefore, the instances of overlapping between contact plug 424 and its surrounding support structures can be reduced.

Figure 7:
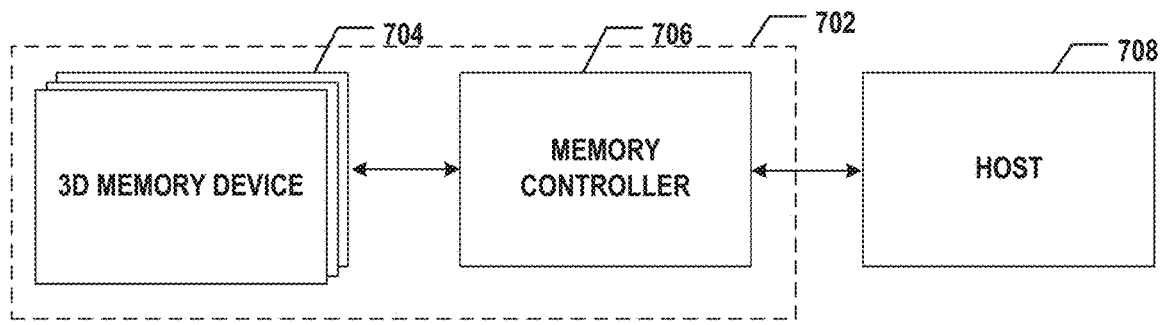
FIG. 7 illustrates a block diagram of an exemplary system having a 3D memory device, according to some implementations of the present disclosure.

FIG. 7 illustrates a block diagram of an exemplary system 700 having a 3D memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, system 700 can include a host 708 and a memory system 702 having one or more 3D memory devices 704 and a memory controller 706. Host 708 can be a processor of an electronic device, such as a central processing unit (CPU), or a system-on-chip (SoC), such as an application processor (AP). Host 708 can be configured to send or receive data stored in memory device 704.

3D memory device 704 can be any 3D memory device disclosed herein, such as 3D memory device 400 shown in FIG. 4A. In some implementations, each 3D memory device 704 includes a NAND Flash memory. Consistent with the scope of the present disclosure, 3D memory device 704 can be fabricated by forming a stack structure laterally on the substrate. The stack structure may have a central region and a staircase region. Subsequently, a plurality of support structures extending vertically in the staircase region and a plurality of channel structures extending vertically in the central region may be formed. The vertical projection of at least one of the support structures on a lateral surface of the substrate may have a bead-embedded strip shape. Therefore, the risk of forming cracks due to the gate line annealing process, or other similar processes, among the 3D memory device can be greatly reduced. As a result, the electric performance of 3D memory device 704 can be improved, which in turn improves the performance of memory system 702 and system 700, e.g., achieving more stable electrical properties and enhancing use cycles thereof.

Memory controller 706 is coupled to 3D memory device 704 and host 708 and is configured to control 3D memory device 704, according to some implementations. Memory controller 706 can manage the data stored in 3D memory device 704 and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, formatting 3D memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 8A, 8B:
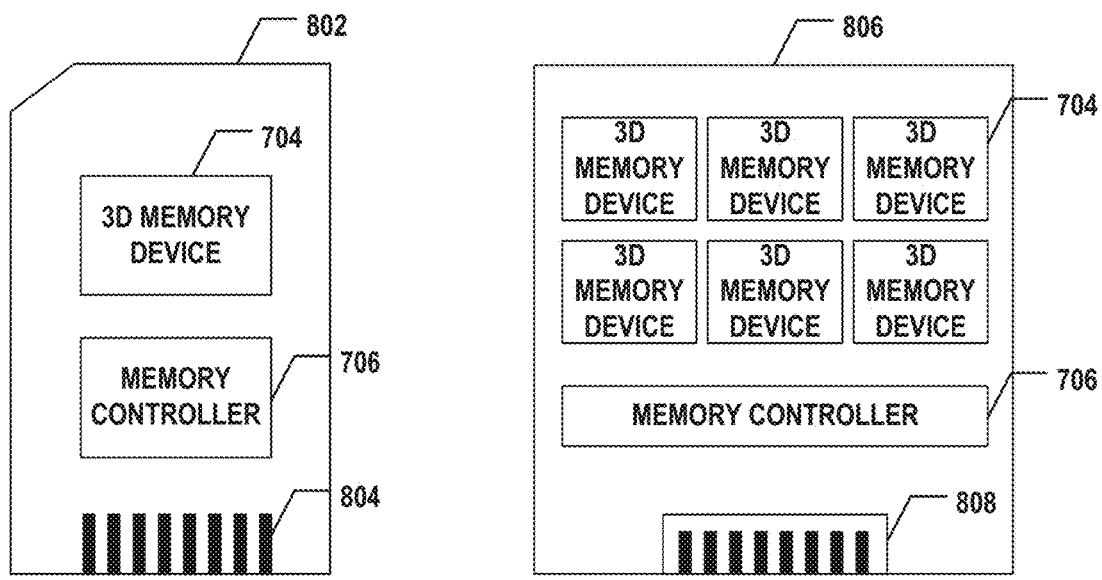
FIG. 8A illustrates a schematic diagram of an exemplary memory card having a 3D memory device, according to some implementations of the present disclosure.
FIG. 8B illustrates a schematic diagram of an exemplary solid-state drive (SSD) having a 3D memory device, according to some implementations of the present disclosure.

Memory controller 706 and one or more 3D memory devices 704 can be integrated into various types of storage devices, for example, be included in the same package, such as a universal Flash storage (UFS) package or an eMMC package. That is, memory system 702 can be implemented as and packaged into different types of end electronic products. In one example as shown in FIG. 8A, memory controller 706 and a single 3D memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 electrically coupling memory card 802 with a host (e.g., host 708 in FIG. 7). In another example as shown in FIG. 8B, memory controller 706 and multiple 3D memory devices 704 may be integrated into an SSD 806. SSD 806 can further include an SSD connector 808 electrically coupling SSD 806 with a host (e.g., host 708 in FIG. 7). In some implementations, the storage capacity and/or the operation speed of SSD 806 is greater than those of memory card 802.

FIGS. 5A-5M illustrate a fabrication process for forming an exemplary 3D memory device 500, according to some implementations of the present disclosure. FIG. 6 illustrates a flowchart of a method 600 for forming exemplary 3D memory device 500, according to some implementations of the present disclosure. Examples of 3D memory device 500 depicted in FIGS. 5A-5M and 6 include 3D memory device 400 depicted in FIG. 4A. FIGS. 5A-5M and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a substrate 502 is provided. Substrate 502 may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 502 is a thinned substrate (e.g., a semiconductor layer), which was thinned by grinding, etching, chemical mechanical polishing (CMP), or any combination thereof. Substrate 502 of 3D memory device 500 may include two lateral surfaces (e.g., a top surface and a bottom surface) extending laterally in the plane defined by the x-direction and the y-direction, both of which are perpendicular to the z-direction. In some implementations, a stop layer (not shown) may be formed on the top surface of substrate 502 using one or more thin film deposition processes including, but not limited to, CVD, physical vapor deposition (PVD), atomic layer deposition (ALD), or any combination thereof. The stop layer may serve as an etch stopper. The stop layer may include any dielectric materials including, but not limited to, silicon oxide, silicon nitride, silicon oxynitride, low-k dielectrics, or any combination thereof. It is understood that in some examples, pad oxide layers (e.g., silicon oxide layers) may be formed between substrate 502 and the stop layer to relax the stress between different layers and avoid peeling. It is understood that in some examples, substrate 502 may be removed from the final product of the 3D memory device. For example, substrate 502 may be replaced by a semiconductor layer, such as a polysilicon layer, formed by a thin film deposition process.

Figure 5A:
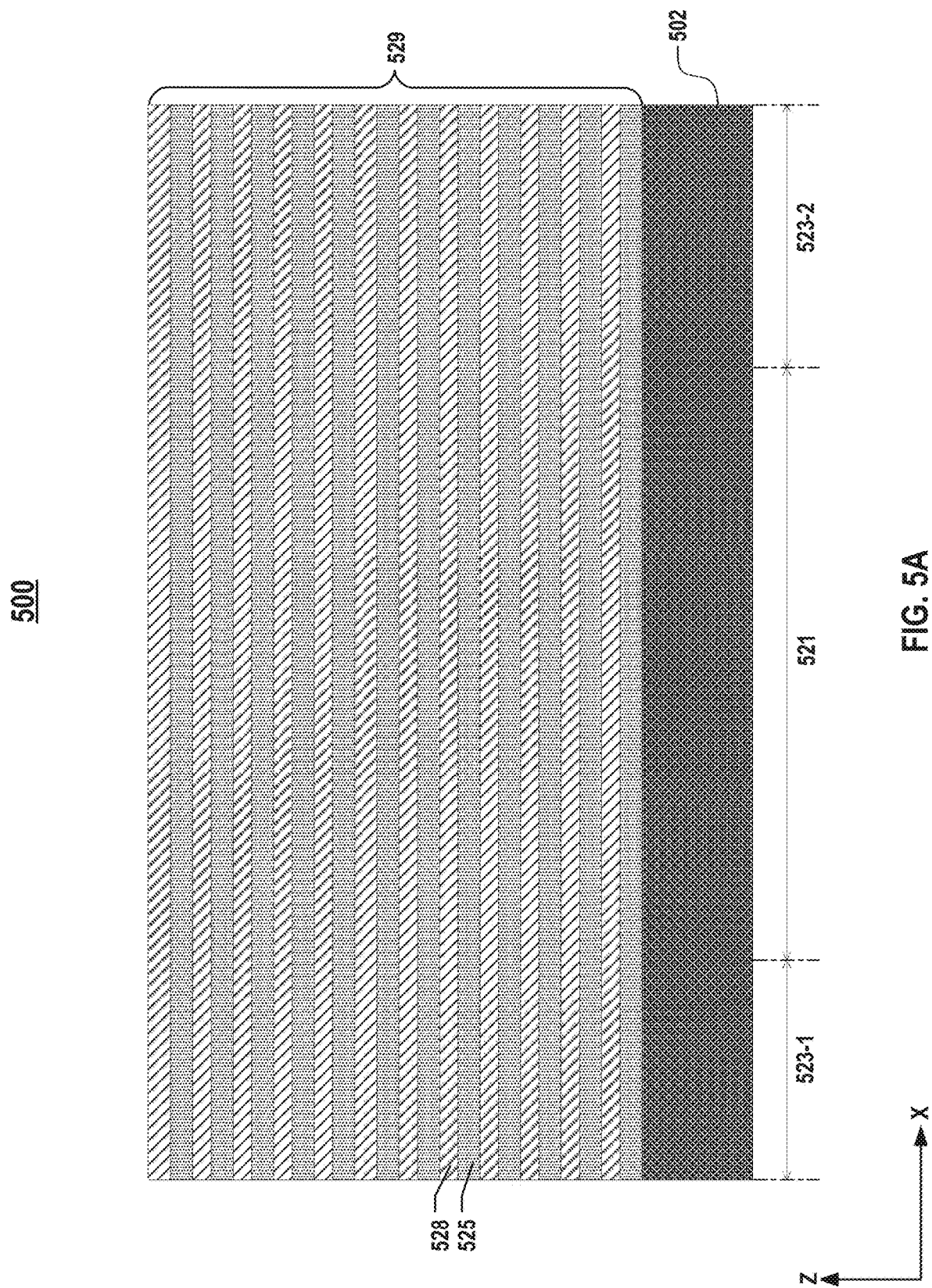
FIGS. 5A-5M illustrate a fabrication process for forming an exemplary 3D memory device, according to some implementations of the present disclosure.
Figure 6:
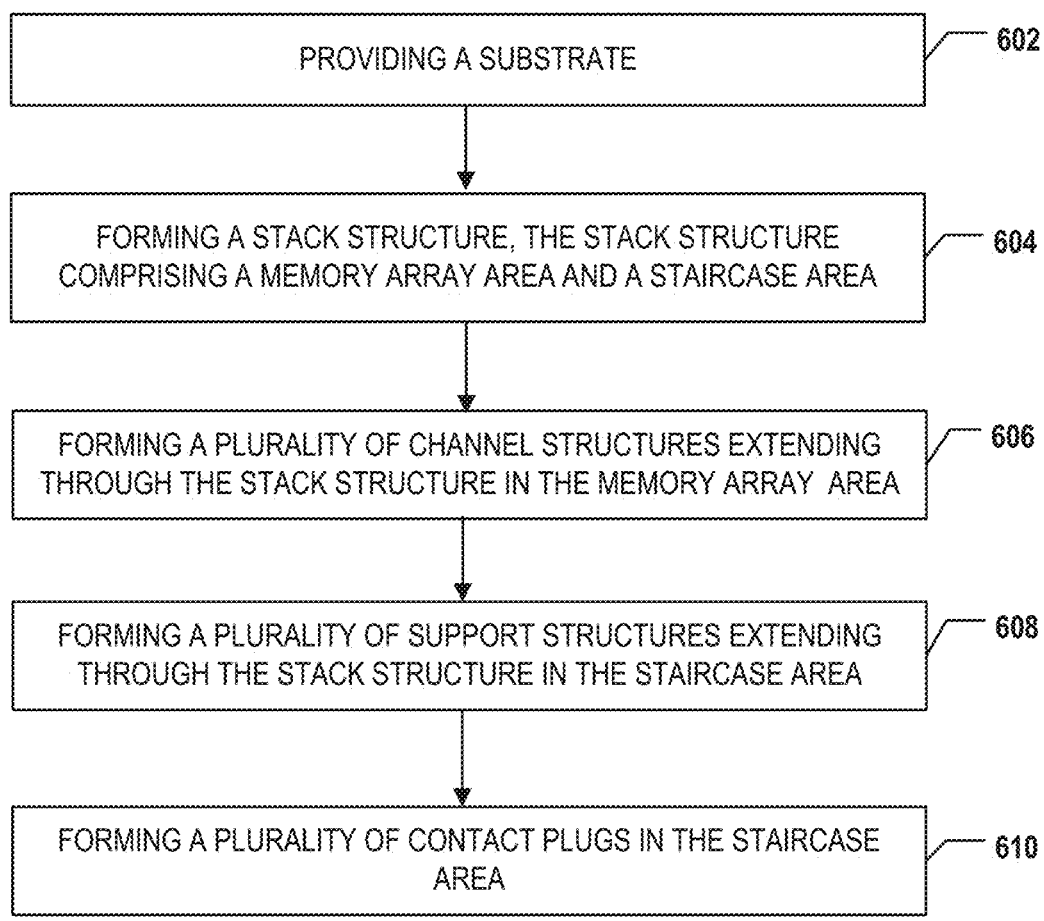
FIG. 6 illustrates a flowchart of a method for forming an exemplary 3D memory device, according to some implementations of the present disclosure.

Method 600 proceeds to operation 604, in which a stack structure may be formed on substrate 502, as shown in FIG. 5A. At the start of this operation, a dielectric stack 529 including a plurality of pairs of a first dielectric layer 525 (referred to herein as "sacrificial layer") and a second dielectric layer 528 (referred to herein as "dielectric layer," together referred to herein as "dielectric layer pairs") may be formed on substrate 502. Dielectric stack 529 may include interleaved sacrificial layers 525 and dielectric layers 528, according to some implementations. In some implementations, sacrificial layers 525 are subsequently replaced by conductive layers 526, which will be described in detail below. Dielectric layers 528 and sacrificial layers 525 can be alternatingly deposited on substrate 502 to form dielectric stack 529. In some implementations, each dielectric layer 528 includes a layer of silicon oxide, and each sacrificial layer 525 includes a layer of silicon nitride. Dielectric stack 529 can be formed by one or more thin film deposition processes including, but not limited to, CVD, PVD, ALD, or any combination thereof.

In some implementations, dielectric stack 529 may include a core region 521 in the middle and two staircase regions 523-1, 523-2 on the sides adjacent to core region 521. It should be understood that although two staircase regions 523-1, 523-2 are shown in FIG. 5A, which only illustrates one cross-section of 3D memory device 500 in the middle of fabrication, 3D memory device 500 according to the present disclosure may include three or four staircase regions surrounding the core region. The two or more staircase regions are collectively referred to as staircase region 523. As will be further described in detail below, a plurality of channel structures 522 are formed in the core region, and a plurality of support structures (not shown) and a plurality of contact plugs 524 are formed in the staircase region.

Figure 5B:
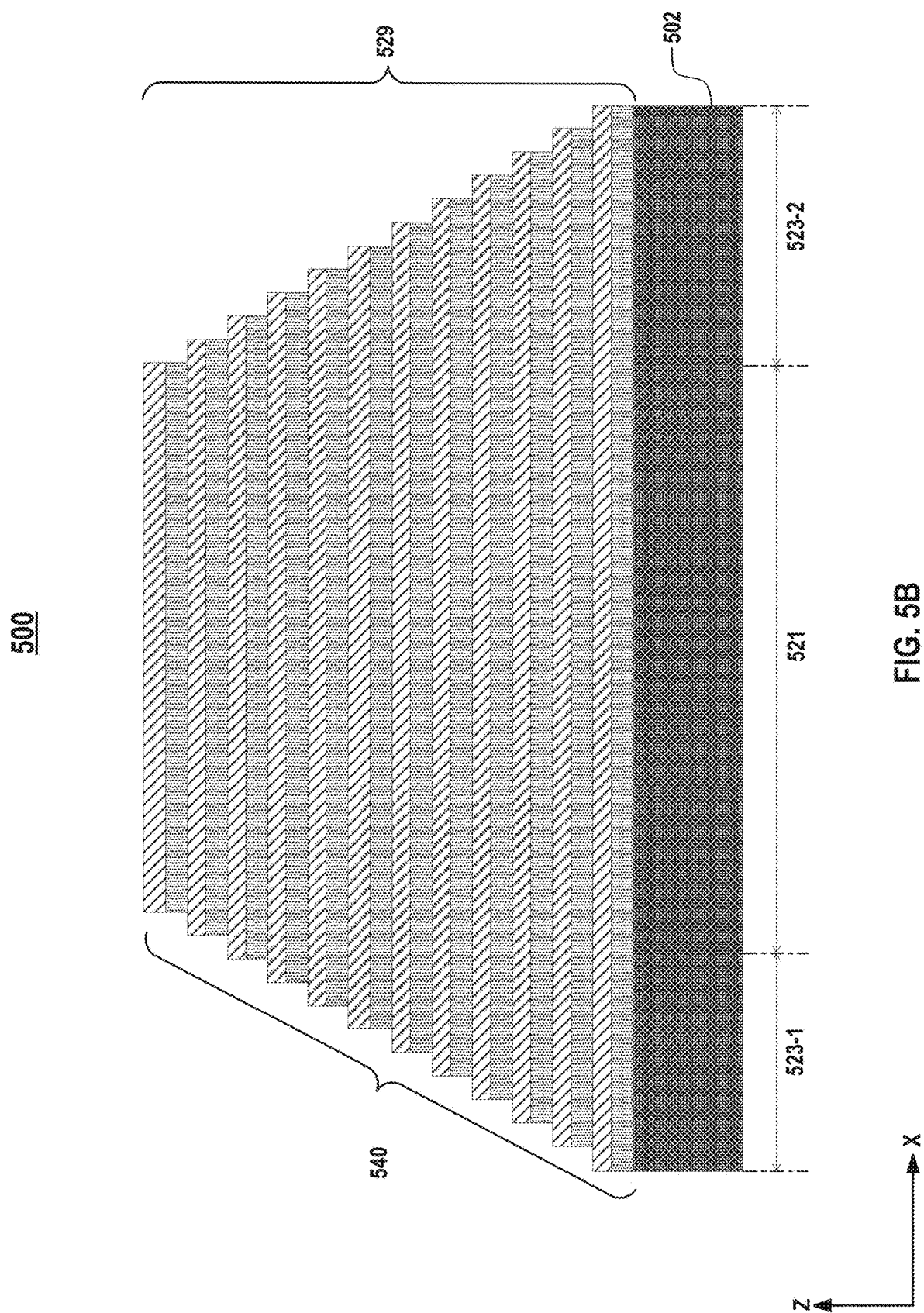

In some implementations, a staircase structure 540 can be further formed in staircase regions 523-1, 523-2 of dielectric stack 529, as shown in FIG. 5B. Staircase structure 540 can be formed by performing a plurality of so-called "trim-etch" cycles to the dielectric layer pairs of dielectric stack 529 toward substrate 502. Due to the repeated trim-etch cycles applied to the dielectric layer pairs of dielectric stack 529, dielectric stack 529 can have one or more tilted edges and an upper dielectric layer pair is shorter than a lower one.

Figure 5C:
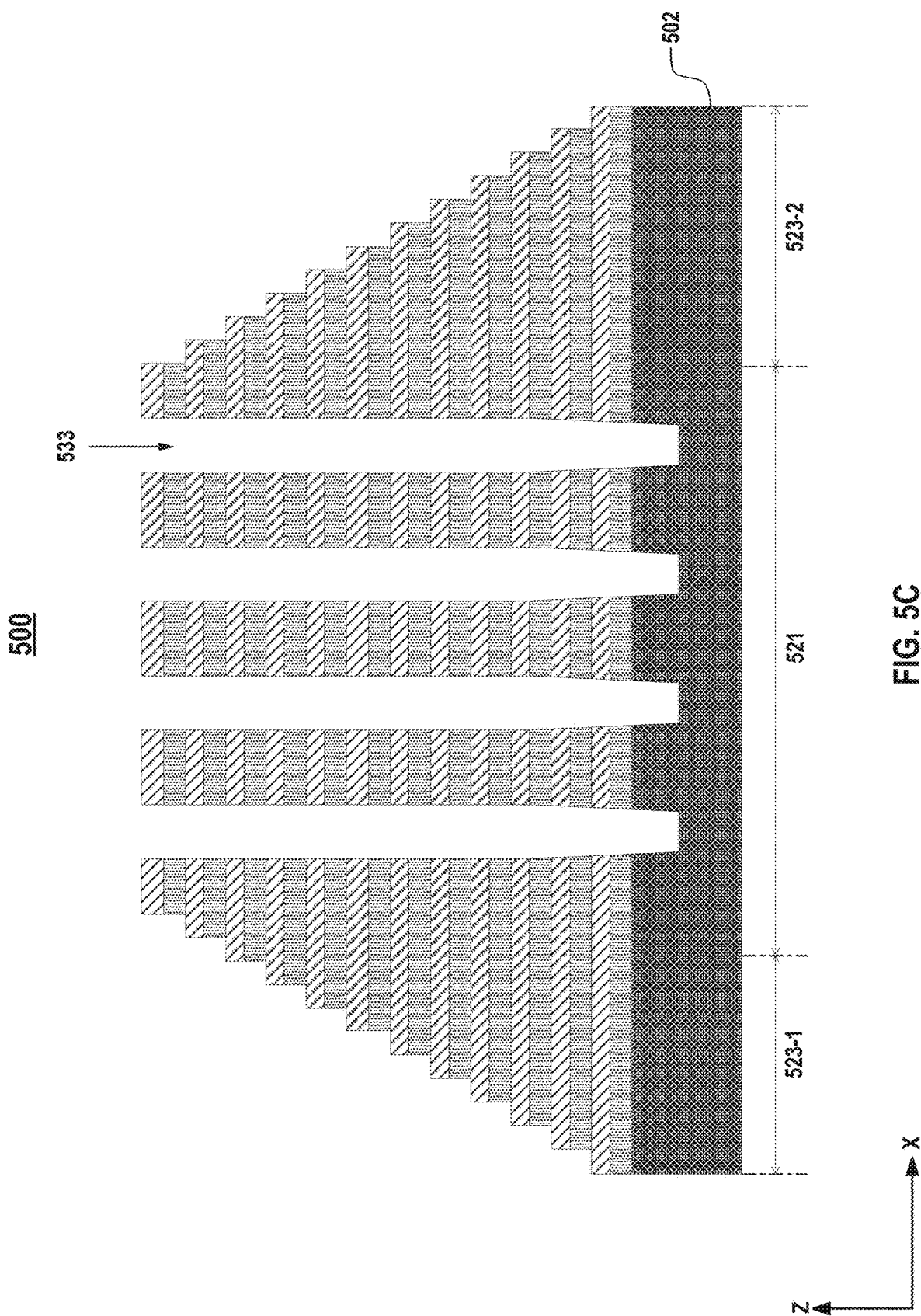

Method 600 then proceeds to operation 606, in which a plurality of channel structures are formed and extend vertically in core region 521. As shown in FIG. 5C, a plurality of channel holes 533 are etched vertically in core region 521. In some implementations, a plurality of openings are formed, such that each opening becomes the location for growing an individual channel structure 522 in the later process (shown in FIG. 5D). Fabrication processes for forming channel holes 533 may include wet etching and/or dry etching, such as deep reactive ion etching (DRIE). The etching of channel holes 533 may continue until it reaches substrate 502. In some implementations, the etching conditions, such as etching rate and time, can be controlled to ensure that each channel hole 533 has reached substrate 502, sometimes with the help of the stop layer, to minimize the gouging variations among channel holes 533 and channel structures 522 formed therein.

Figure 5D:
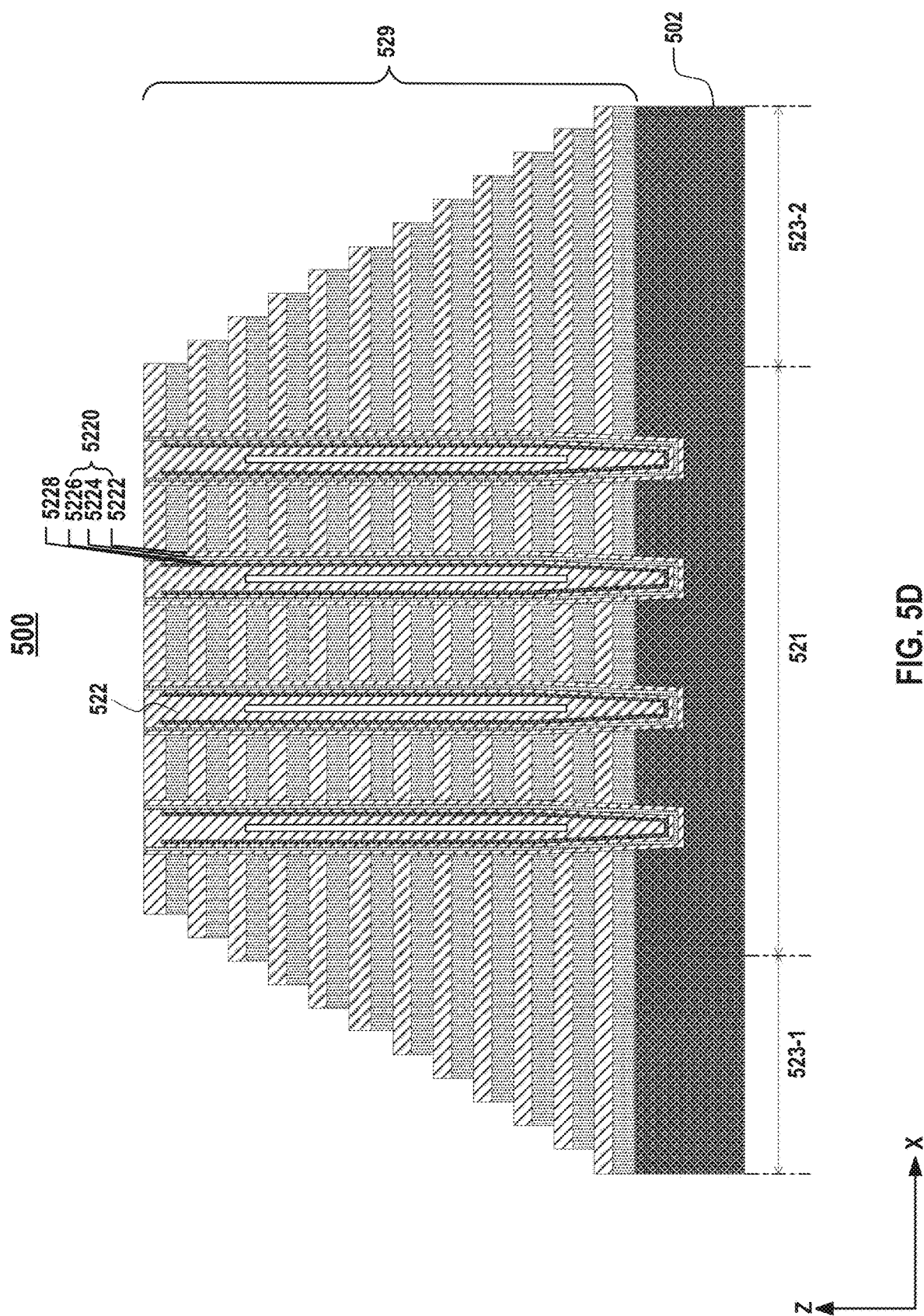

In some implementations, each channel structure 522 can include a memory film 5220 and a semiconductor channel 5228. As shown in FIG. 5D, to form channel structure 522, memory film 5220 and semiconductor channel 5228 may be sequentially formed along a sidewall of and a bottom surface of channel hole 533. In some implementations, memory film 5220 may include a blocking layer 5222, a storage layer 5224, and a tunneling layer 5226. In some implementations, blocking layer 5222, storage layer 5224, and tunneling layer 5226 are first deposited along the sidewalls and bottom surface of channel hole 533 in this order using one or more thin film deposition processes, such as ALD, CVD, PVD, any other suitable processes, or any combination thereof, to form memory film 5220. Semiconductor channel 5228 can then be formed by depositing a semiconductor material, such as polysilicon (e.g., undoped polysilicon), over tunneling layer 5226 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are sequentially deposited to form blocking layer 5222, storage layer 5224, and tunneling layer 5226 of memory film 5220 and semiconductor channel 5228.

Figure 5E:
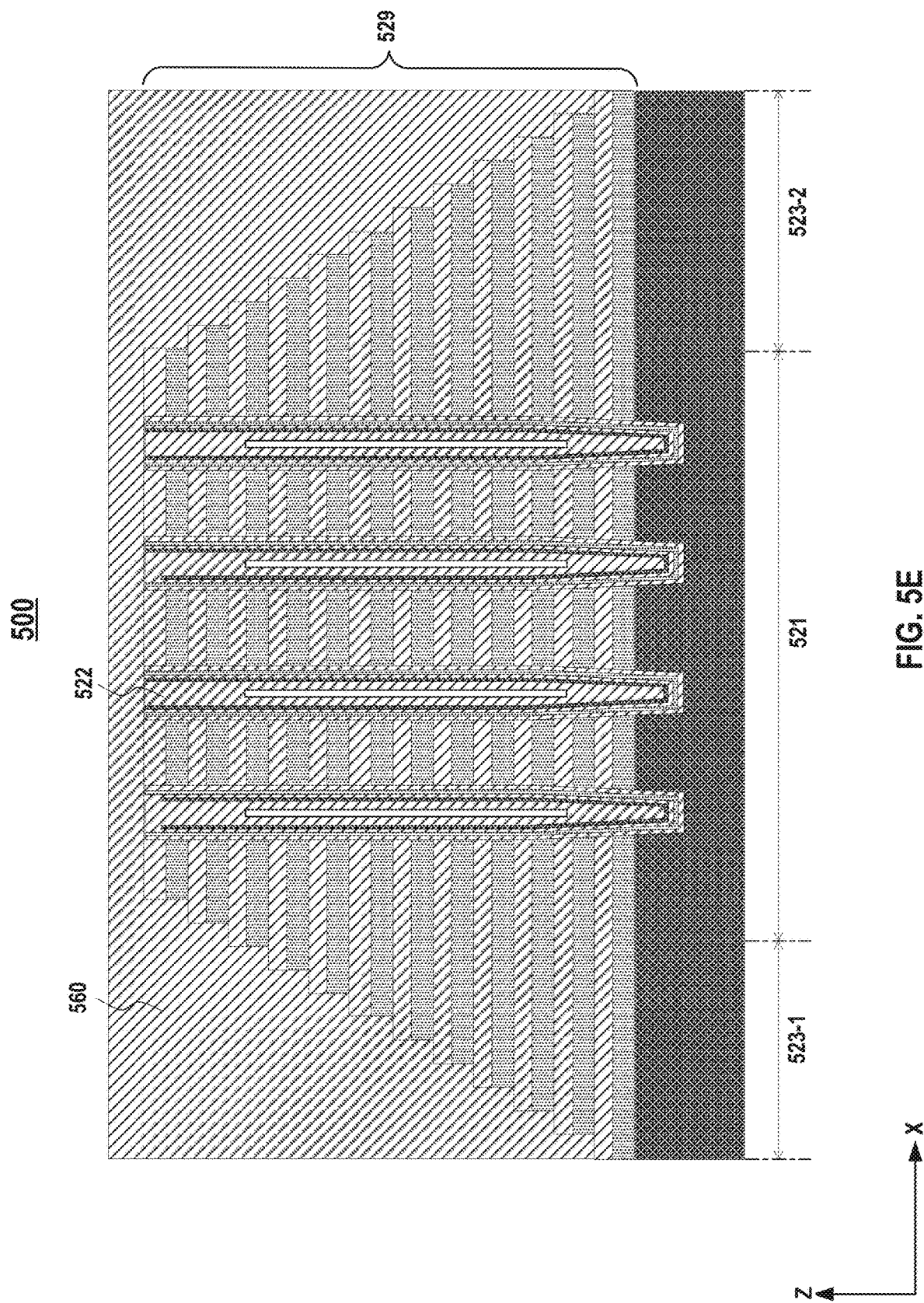

In some implementations, an outer insulating layer 560 may be formed on dielectric stack 529, as shown in FIG. 5E. In some implementations, outer insulating layer 560 may cover at least staircase region 523. In some other implementations, outer insulating layer 560 may cover both staircase region 523 and core region 521 in their entirety. Outer insulating layer 560 may protect channel structures 522 from being damaged by subsequent fabrication processes.

Figure 5F:
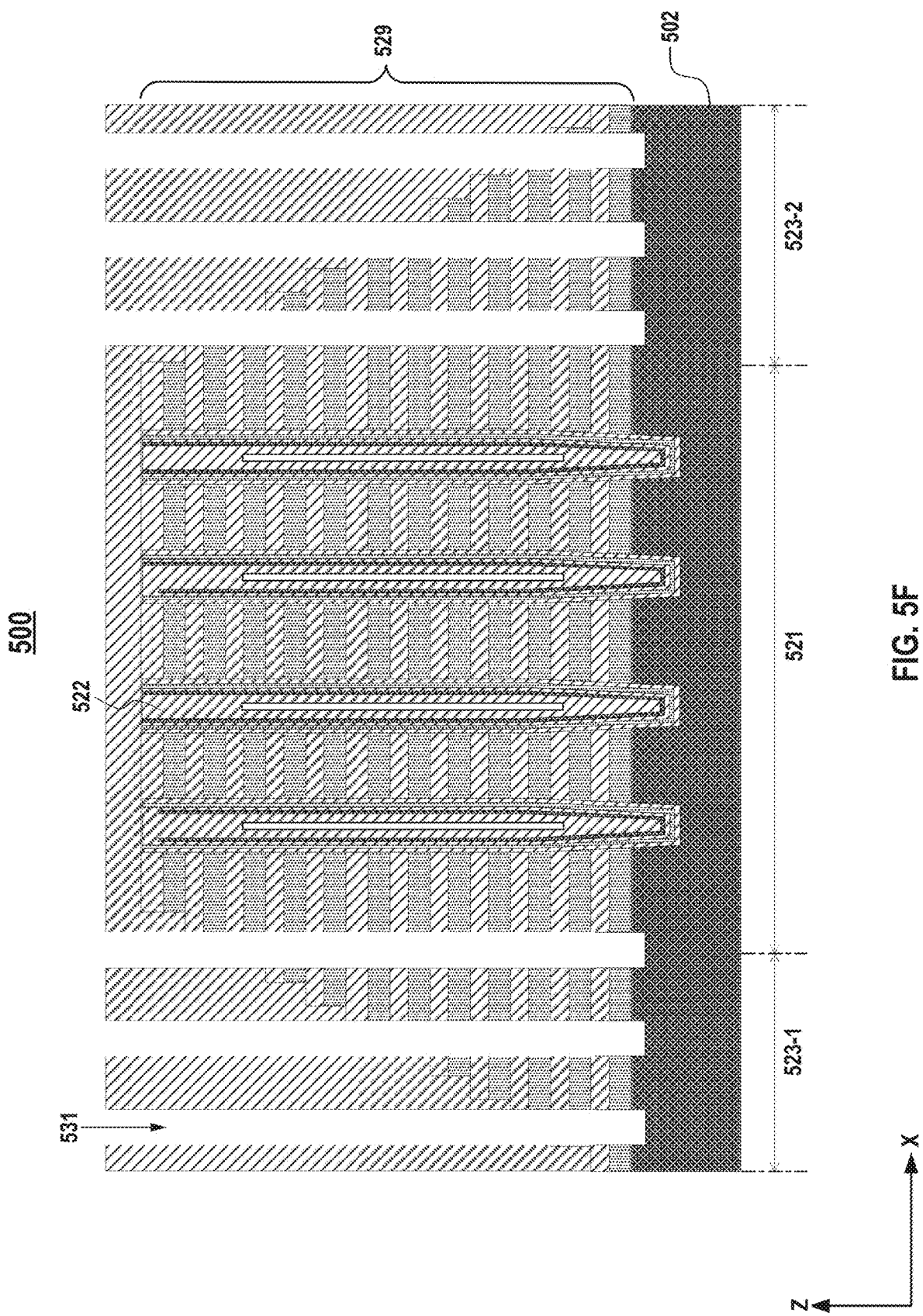

Method 600 then proceeds to operation 608, in which a plurality of support structures are formed through outer insulating layer 560 and the stack structure in staircase region 523. In some implementations, to form support structures in dielectric stack 529, a plurality of holes 531 are etched vertically in staircase region 523, as shown in FIG. 5F.

Figure 4D:
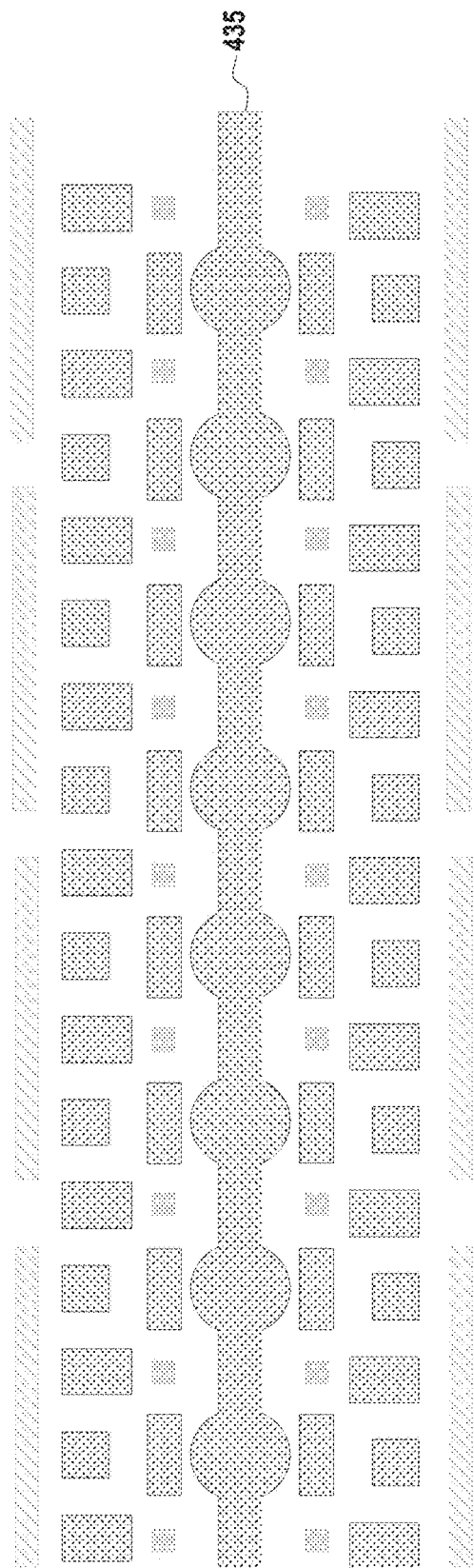
FIG. 4D illustrates an exemplary design pattern of support structures in a staircase region of a 3D memory device, according to some implementations of the present disclosure.

According to some implementations of the present disclosure, the etching of holes 531 may be performed by using a photomask (not shown) having a designed pattern with bead-embedded strip shape 435 (without seams) and block shapes, as shown in FIG. 4D, which illustrates a design pattern of support structures in a part of a staircase region according to some implementations. Accordingly, the formed holes 531 may have certain square- or rectangular-shape holes, and bead-embedded strip shape holes (or trenches), or certain other types of holes. In some implementations, the pattern of the photomask may be optimized to obtain the holes with proper shapes and sizes (e.g., the proper bead shape and size in a bead-embedded strip shape hole). Fabrication processes for forming holes 531 may include wet etching and/or dry etching, such as DRIE. Holes 531 may be etched to pass through the entire height of dielectric stack 529 and reach substrate 502, as shown in FIG. 5F.

Figure 5G:
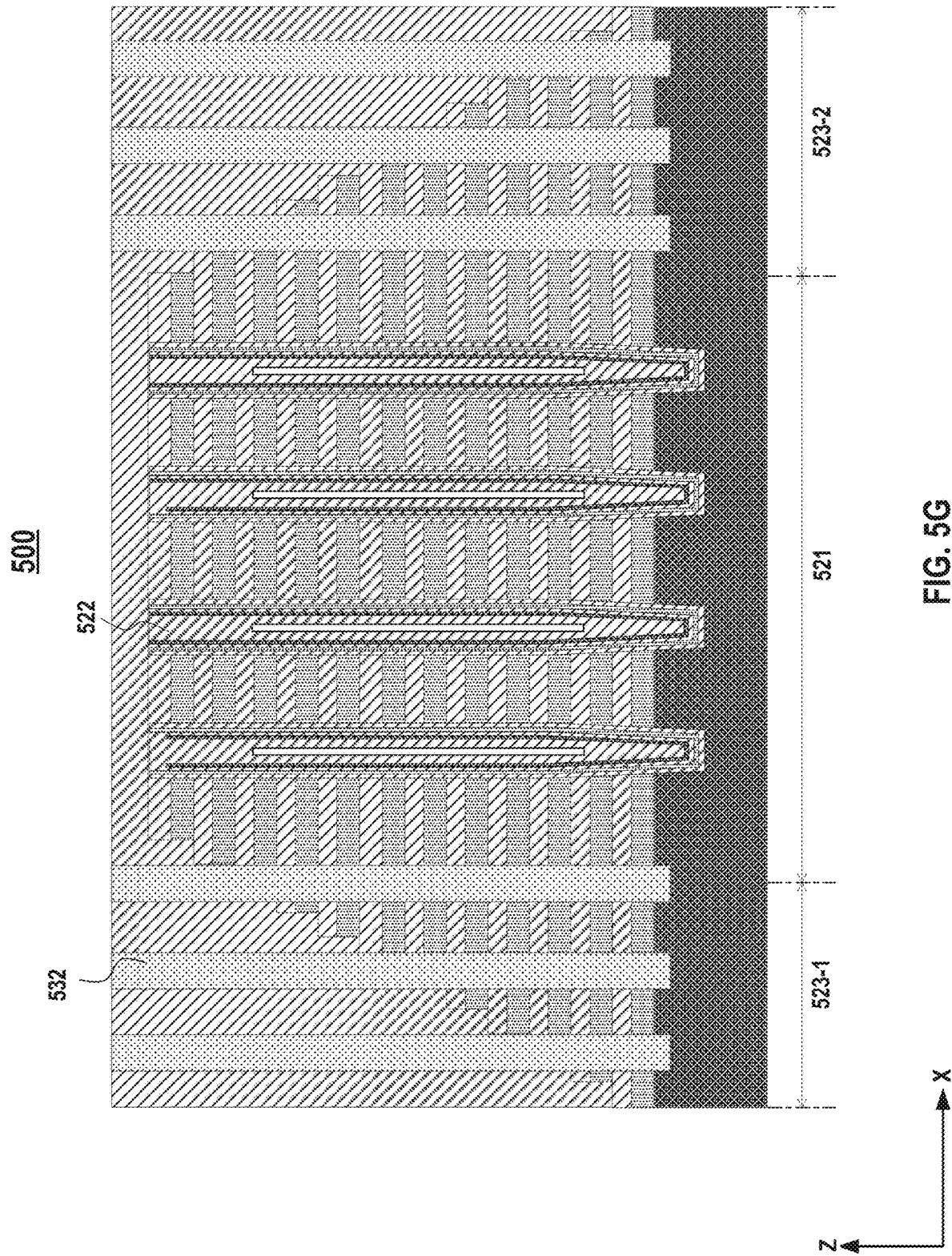

In some implementations, holes 531 may be filled in with an insulation material to form the plurality of support structures 532, as shown in FIG. 5G. The insulation material may include, but not limited to, silicon oxide, silicon nitride, silicon oxynitride, low dielectric constant (low-k) dielectrics, or any combination thereof. The filled-in support structures 532 may support the overall structural robustness of the stack structure and prevent the various internal components, such as to-be-formed word lines, from bending. In some implementations, the filled-in support structures (e.g., the strip shape support structures) may additionally separate 3D memory device 500 into multiple blocks or fingers. In other implementations, support structures 532 may be formed in core region 521 as well, depending on the needs of the manufacturer and/or applications of 3D memory device 500.

Figure 5H:
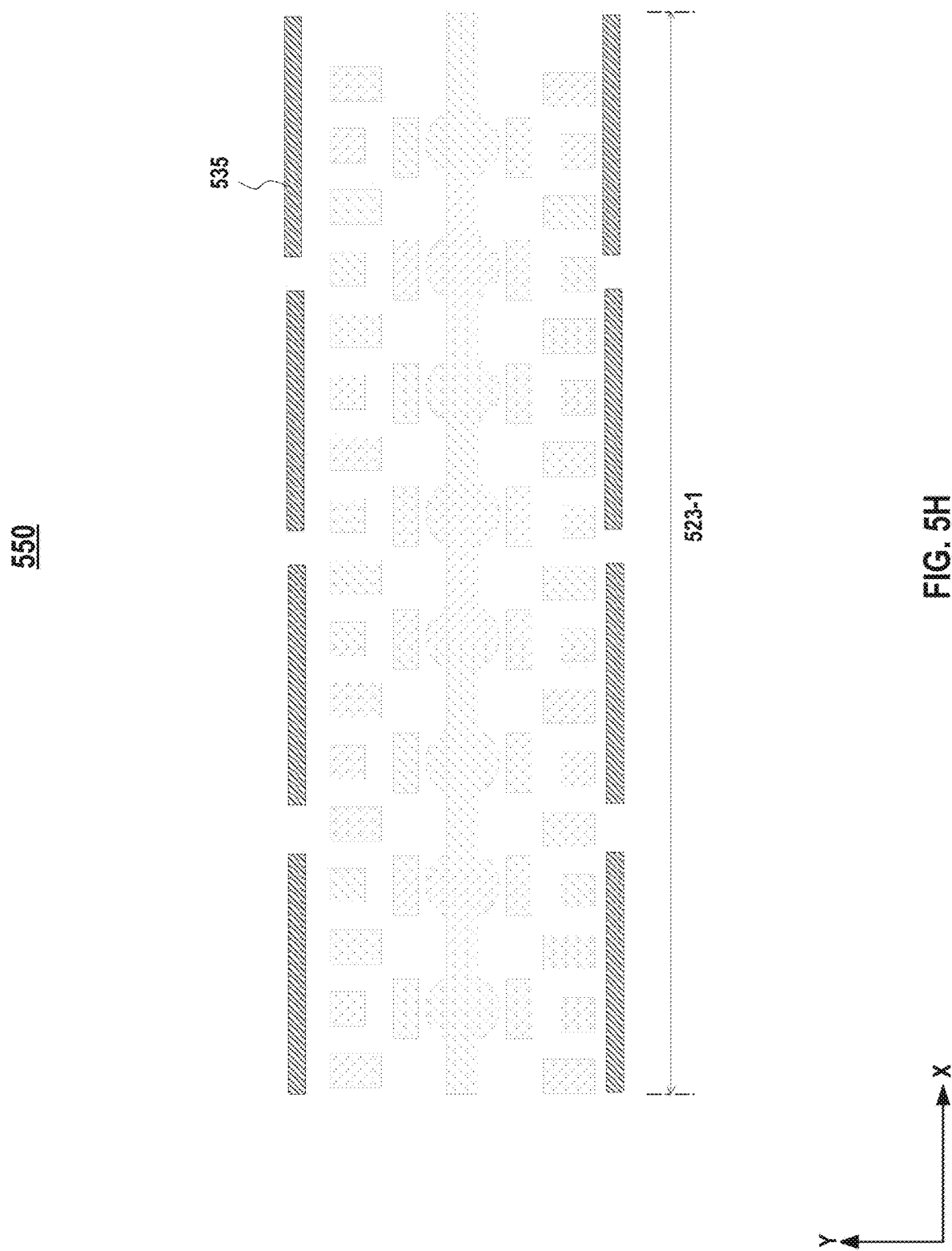

In some implementations, a plurality of gate line slits 535 may be further formed in and extend vertically through outer insulating layer 560 and dielectric stack 529, as shown in FIG. 5H from a top view 550 of a cross-section of a staircase region of 3D memory device 500. In some implementations, fabrication processes for forming gate line slits 535 include wet etching and/or dry etching, such as DRIE. In some implementations, gate line slits 535 may extend laterally through both core region 521 and staircase region 523 in a first direction (e.g., x-direction) on a plane defined by x-direction and y-direction. Gate line slits 535 may be spaced apart from each other along a second direction (e.g., y-direction) perpendicular to the first direction. Although gate line slits 535 are illustrated to have one or more gaps therebetween in FIG. 5H, it is understood that continuous gate line slits 535, which means no gaps are created along an extended gate line slit 535, are also conceived according to the present disclosure.

Figure 5I:
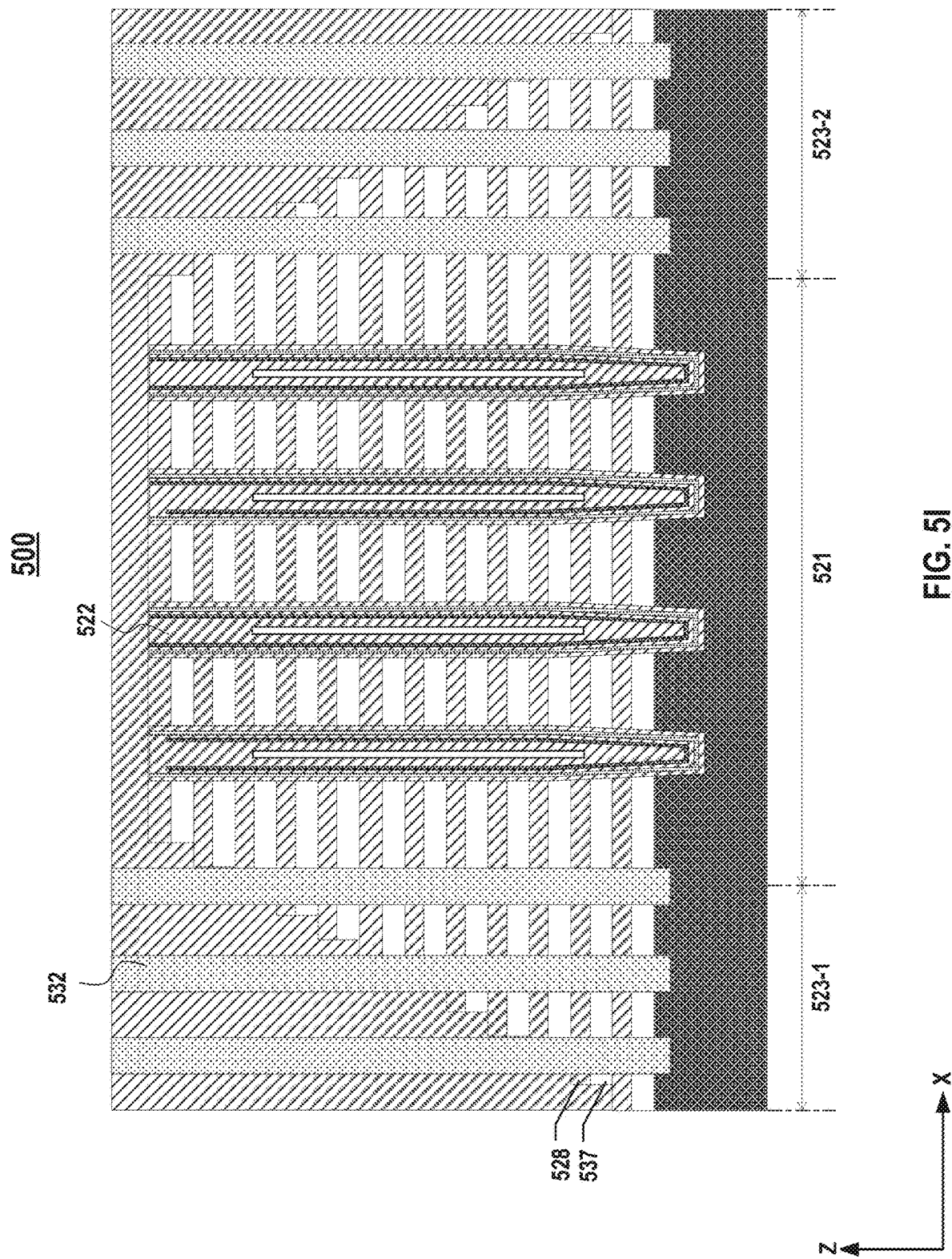
Figure 5J:
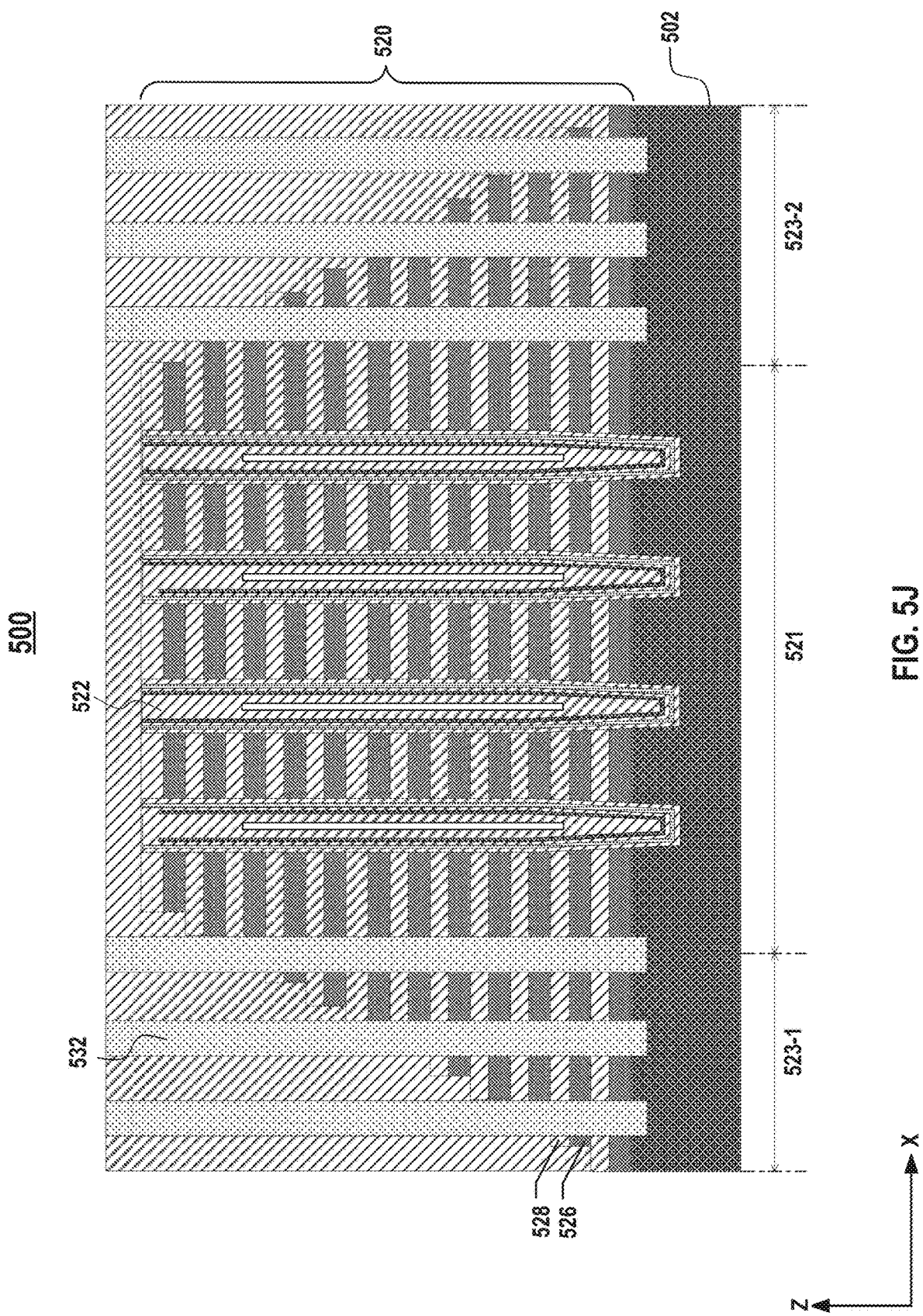

Subsequently, a gate replacement process may be performed through gate line slits 535 to replace dielectric stack 529 within stack structure 520, also known as a memory stack (shown in FIG. 5J). Specifically, lateral recesses 537 are first formed by removing sacrificial layers 525 through gate line slits 535, as shown in FIG. 5I. In some implementations, sacrificial layers 525 are removed by applying etchants through gate line slits 535 (not shown in FIG. 5I), creating lateral recesses 537 interleaved between dielectric layers 528. The etchants can include any suitable etchants that etch sacrificial layers 525 selective to dielectric layers 528.

In some implementations, the removal of sacrificial layers 525 may cause unbalanced stress on the stack structure, especially in staircase regions 523. The formed support structures 532 may provide necessary support to the stack structure in the staircase regions when sacrificial layers 525 are removed. In some implementations, after removal of sacrificial layers 525, conductive layers 526 (including gate electrodes and adhesive layers) may be further deposited into lateral recesses 537 through gate line slits 535, as shown in FIG. 5J. In some implementations, a gate dielectric layer (not shown) is deposited into lateral recesses 537 prior to conductive layers 526, such that conductive layers 526 are deposited on the gate dielectric layer. Conductive layers 526, such as metal layers, can be deposited using one or more thin film deposition processes, such as ALD, CVD, PVD, any other suitable processes, or any combination thereof. In some implementations, the gate dielectric layer, such as a high-k dielectric layer, is formed along the sidewall and at the bottom of gate line slits 535 as well. Stack structure 520 including interleaved conductive layers 526 and dielectric layers 528 is thereby formed, replacing dielectric stack 529, according to some implementations. In some implementations, a portion of substrate 502 is replaced with a conductive material via gate line slits 535. Thus, substrate 502 may be electrically connected with channel structures 522. Subsequently, gate line slits 535 may be filled in with an insulation material to form gate lines. Similar to gate line slits 535, gate lines may continuously or discretely extend through core region 521 and staircase region 523.

In some implementations, a gate line annealing process may also be performed to remove hydrogen or other residues after the formation of gate lines. However, the gate line annealing process may put pressure on the formed seams along the strip shape support structures, which may cause risk of crack formation if the formed seams along the strip shape support structures are not stress-resistant. In the disclosed 3D memory device, due to the embedded beads along the elongated central strip shape support structure 435 included in the designed pattern 480 in FIG. 4D during the lithography process, the formed bead-embedded strip shape support structures may effectively reduce stresses placed on the support structures, thereby reducing the risk of the crack formation in the support structures in the gate line annealing process, or in other similar or different processes that may cause increased stress on the formed strip shape support structures.

Figure 5K:
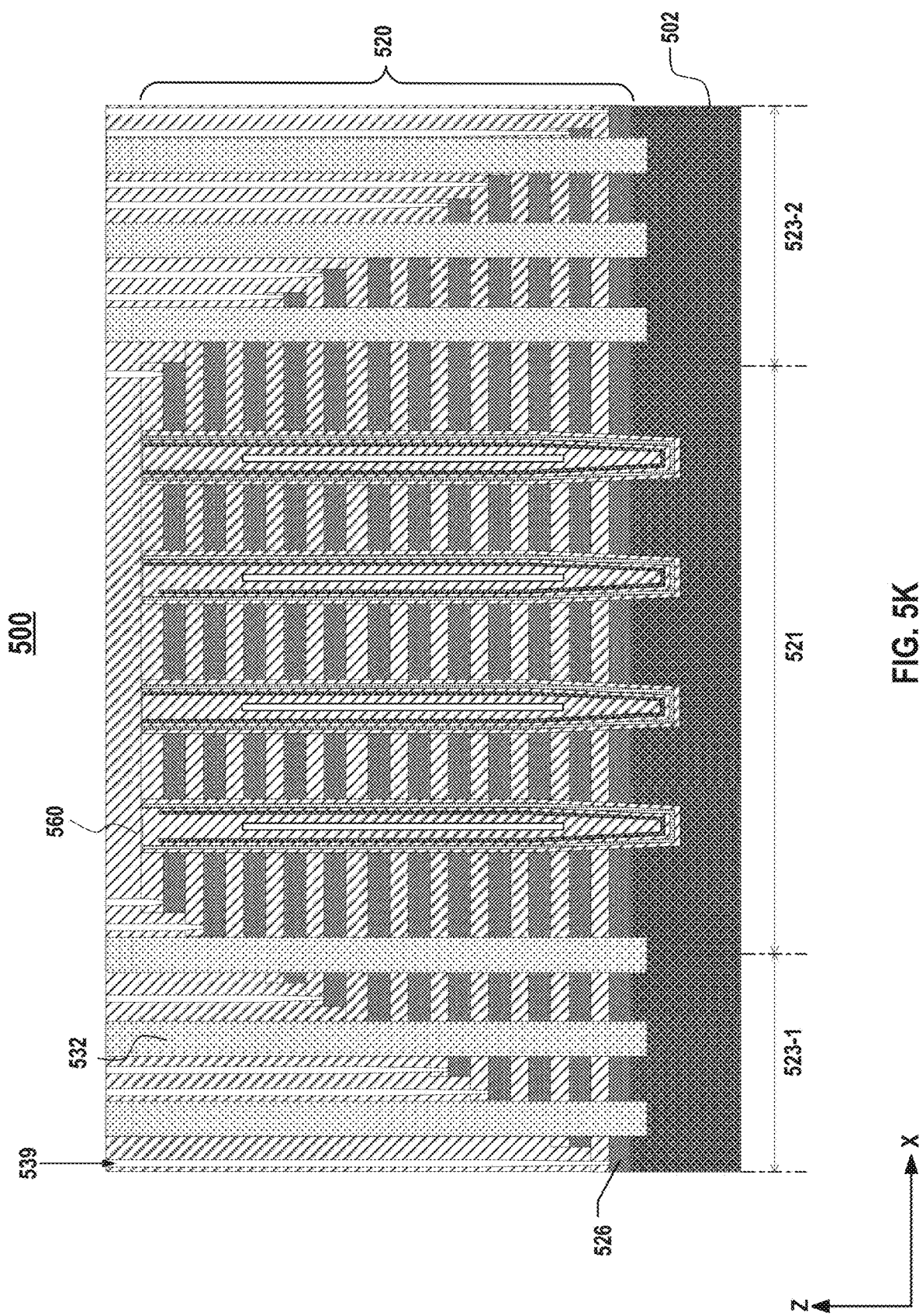
Figure 5L:
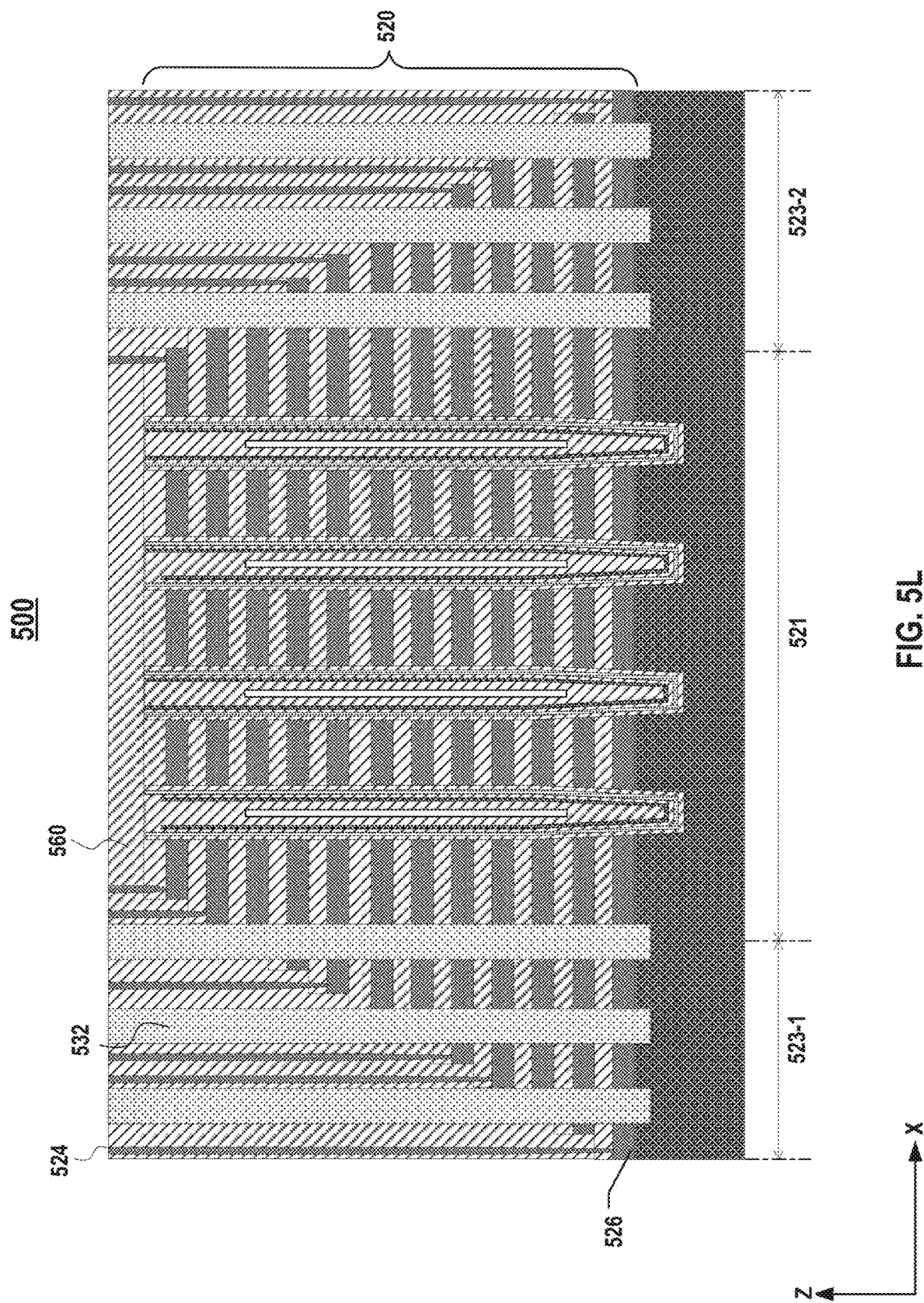

Method 600 then proceeds to operation 610, in which a plurality of contact plugs are formed in staircase region 523 and electrically connected to stack structure 520. In some implementations, a plurality of contact holes 539 may be formed by etching vertically in staircase region 523 of stack structure 520, as shown in FIG. 5K. Such formation process may include wet etching and/or dry etching, such as DRIE. Each contact hole 539 may be etched until its bottom reaches a conductive layer 526. Thus, an electrical connection may be established between word lines of stack structure 520 and peripheral circuits (not shown) of 3D memory device 500 via contact plugs 524, as shown in FIG. 5L, which are formed by filling in contact holes 539 with a conductive material using one or more thin film deposition processes, such as ALD, CVD, PVD, any other suitable processes, or any combination thereof. The contact material may include, but not limited to, W, Co, Cu, Al, silicides, or any combination thereof. In some implementations, the upper surfaces of contact plugs 524 are flush with the upper surface of dielectric cover layer 560 (not shown).

Figure 5M:
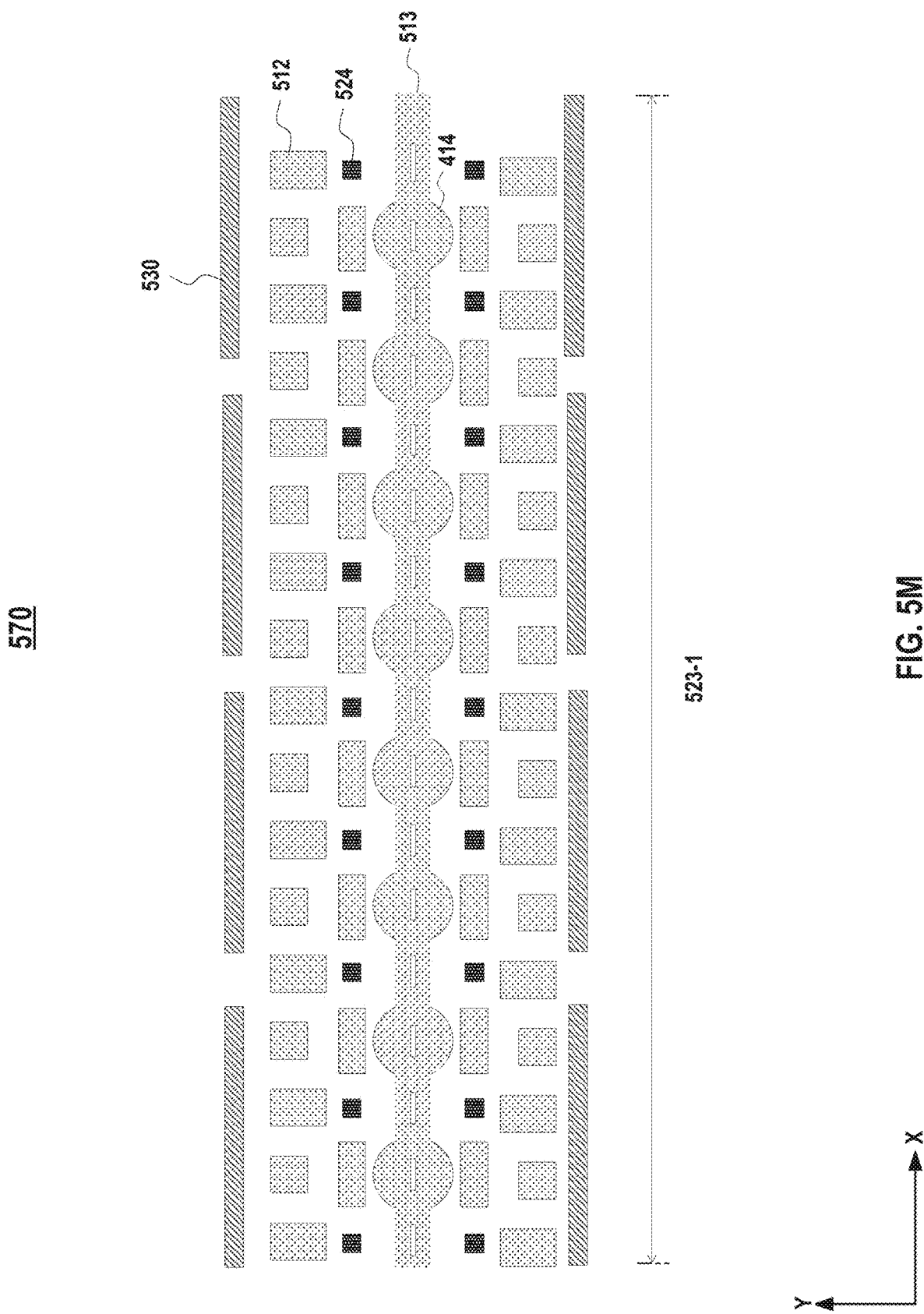

FIG. 5M illustrates a top view of a cross-section of a staircase region 523-1 of 3D memory device 500 after the formation of support structures and contact plugs in the staircase region, according to some implementations of the present disclosure. As illustrated, staircase region 523-1 may include multiple arrays of contact plugs 524 and a variety of support structures 512/513. Although only staircase region 523-1 is used as an exemplary implementation of the present disclosure, it is understood that the same support structures may be equally applied to other staircase region(s) or even certain core region 521 of 3D memory device 500, according to the present disclosure.

Support structures according to the present disclosure may include at least one bead-embedded strip shape support structure 513. In some implementations, support structures according to the present disclosure may additionally include block shape support structures 512 that, together with the at least one bead-embedded strip shape support structure 513, provides support to the conductive layers in the 3D memory device.

In some implementations, 3D memory device 500 further includes at least one gate line slit 530. In some implementations, gate line slits 530 continuously extend through core region 521 and staircase region 523. In other implementations, gate line slits 530 discretely extend through the same areas, which means one or more gaps are created along the extended at least one gate line slit 530. Multiple gate line slits 530 may extend along a first direction (e.g., x-direction) parallelly while being aligned with distances from each other along a second direction (e.g., y-direction) perpendicular to the first direction, as shown in FIG. 5M.

According to the present disclosure, a staircase region that includes contact plugs and support structures, such as staircase region 570, may be adjusted with various improvements. In some implementations, block shape support structures 512 may be arranged in a two-dimensional array, as shown in FIG. 5M. Similarly, contact plugs 524 may also be arranged in a two-dimensional array. Each row of the array of contact plugs 524 may be separated by one or more rows of the block shape support structure array. In some implementations, there are certain adjacent rows of the support structure array between which no contact plug 524 is formed (not shown in FIG. 5M). For instance, there is one additional row of block shape support structures 512 aligned between the current rows of the block shape support structures and the extended gate line slits 530. Such an arrangement of support structures and contact plugs may provide structural support across the entirety of the substrate areas where such support structures and contact plugs are located. In some implementations, each contact plug 524 is surrounded by three or more block shape support structures 512 and one bead-embedded strip shape support structure 513 in staircase region 523. This offers all-around protection of the vertical structure of contact plug 524 against undesired squeezing or bending forces created when stack structure 520 is fabricated to be very high, thus exerting tremendous pressure on the internal components of the substrate.

In some implementations, the three or more block shape support structures 512 and the bead-embedded strip shape support structure 513 may be equally separated along a circumference surrounding contact plug 524 on a lateral surface of the stack structure. It should be understood that the above should also include the scenario where the three or more block shape support structures and the bead-embedded strip shape support structure are substantially equally separated along the circumference. The term "substantially," when used in describing the separation among the support structures, means the distances between adjacent support structures or angles towards contact plug 524 being surrounded do not vary above a range, such as ±10%. For example, when there are three block shape support structures and one strip shape support structure, they may be separated with 90 degrees between each pair of the adjacent support structures. This offers equal protection of the vertical structure of contact plug 524 against forces from all directions. In some implementations, a diameter of the circumference, along which three or more block shape support structures and the bead-embedded strip shape support structure are equally separated, is equal to or less than half of the lateral distance between adjacent contact plugs 524. Therefore, the instances of overlapping between contact plug 524 and its surrounding support structures can be reduced.

According to one aspect of the present disclosure, a 3D memory device includes a stack structure containing a core region and a staircase region, a channel structure extending through the stack structure in the core region, and a first support structure extending through the stack structure in the staircase region. The first support structure includes a first portion extending along a first direction and a second portion protruding from the first portion along a second direction perpendicular to the first direction.

In some implementations, the first support structure is located between two blocks of the 3D memory device.

In some implementations, the 3D memory device further includes a second support structure. The second support structure includes a set of block shape support structures arranged in a two-dimensional array.

In some implementations, the second support structure is located within a same memory block.

In some implementations, at least one of the block shape support structures has one of a square shape, a rectangular shape, or a L-shape.

In some implementations, the second portion of the first support structure includes a plurality of curved portions protruding from two opposite sides of the first portion of the first support structure.

In some implementations, the plurality of curved portions are aligned along the two opposite sides of the first portion of the first support structure pair-by-pair.

In some implementations, adjacent two curved portions have a same distance therebetween along the first direction.

In some implementations, a radius of a curved portion is between ¼ of a width of the first portion in the second direction and two times of the width of the first portion in the second direction.

In some implementations, a distance between edges of adjacent two curved portions is between ⅙ of a width of the first portion in the second direction and three times of the width of the first portion in the second direction.

In some implementations, each of the curved portions has a same shape.

In some implementations, each of the curved portions has a shape of a partial of a circle.

In some implementations, each of the curved portions has a shape of a partial of an ellipse.

In some implementations, the 3D memory device further includes a plurality of gate line slits intermittently extending along the first direction. The plurality of gate line slits are located in a same memory block of the 3D memory device.

According to another aspect of the present disclosure, a 3D memory device includes a stack structure including a core region and a staircase region, a channel structure extending through the stack structure in the core region, and a first support structure extending through the stack structure in the staircase region. The first support structure has a bead-embedded strip shape in a plan view.

In some implementations, the first support structure includes one elongated center strip extending along a first direction.

In some implementations, the first support structure further includes one or more beads aligned along the elongated center strip pair-by-pair.

In some implementations, the one or more beads have a same shape.

In some implementations, the one or more beads include two sets of beads with different shapes, each set of beads having a same shape.

In some implementations, edges of adjacent beads have a same distance therebetween along a first direction.

In some implementations, the first support structure includes one or more seams within an elongated center strip structure.

In some implementations, the 3D memory device further includes a plurality of gate line slits intermittently extending along a first direction. The plurality of gate line slits are located in a same memory block of the 3D memory device.

In some implementations, the 3D memory device further includes a second support structure. The second support structure includes a set of block shape support structures arranged in a two-dimensional array.

In some implementations, the 3D memory device further includes a plurality of contact plugs formed in the staircase region.

In some implementations, each contact plug is surrounded by three or more block shape support structures and by the first support structure in the staircase region.

According to another aspect of the present disclosure, a method for forming a three-dimensional (3D) memory device includes forming a stack structure, the stack structure comprising a core region and a staircase region, forming a channel structure extending through the stack structure in the core region, and forming a first support structure extending through the stack structure in the staircase region. The first support structure has a bead-embedded strip shape in a plan view.

In some implementations, forming the first support structure further includes forming an elongated trench through the stack structure in the staircase region and filling in the elongated trench with an insulation material to form the first support structure. The elongated trench includes a plurality of curved portions protruding from two opposite sides of an elongated slit.

In some implementations, the bead-embedded strip shape is a shape including one elongated center strip shape embedded with one or more beads along the elongated center strip shape.

In some implementations, the elongated trench is etched in places of the stack structure between adjacent two blocks of the 3D memory device.

In some implementations, the method further includes forming a second support structure. The second support includes a set of block shape support structures arranged in a two-dimensional array.

In some implementations, the method further includes etching a plurality of channel holes through the stack structure in the core region, and filling in the channel holes with a semiconductor layer and a composite dielectric layer to form a plurality of channel structures.

In some implementations, the method further includes forming a plurality of contact plugs in the staircase region.

According to another aspect of the present disclosure, a system includes a 3D memory device configured to store data and a memory controller coupled to the 3D memory device and configured to control the 3D memory device. The 3D memory device includes a stack structure including a core region and a staircase region, a channel extending through the stack structure in the core region, and a first support structure extending through the stack structure in the staircase region. The first support structure has a bead-embedded strip shape in a plan view.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a stack structure comprising a core region and a staircase region;
   a channel structure extending through the stack structure in the core region; and
   a first support structure extending through the stack structure in the staircase region,
   wherein the first support structure comprises a first portion extending along a first direction and a second portion protruding from the first portion along a second direction perpendicular to the first direction,
   wherein the second portion of the first support structure comprises a first plurality of curved portions protruding from a first side of the first portion and a second plurality of curved portions protruding from a second side of the first portion at predetermined intervals along its length,
   wherein a curvature of each of the first plurality of curved portions and the second plurality of curved portions contacts the first portion, and
   wherein the first support structure is located between two blocks of the 3D memory device.

2. The 3D memory device of claim 1, further comprising a second support structure, wherein the second support structure comprises a set of block shape support structures arranged in a two-dimensional array.

3. The 3D memory device of claim 2, wherein the second support structure is located within a same memory block.

4. The 3D memory device of claim 2, wherein at least one of the block shape support structures has one of a square shape, a rectangular shape, or a L-shape.

5. The 3D memory device of claim 1, wherein the first plurality of curved portions and the second plurality of curved portions are aligned along two opposite sides of the first portion of the first support structure pair-by-pair.

6. The 3D memory device of claim 1, wherein adjacent two curved portions of the first plurality of curved portions or the second plurality of curved portions have a same distance therebetween along the first direction.

7. The 3D memory device of claim 1, wherein a radius of a curved portion is between ¼ of a width of the first portion in the second direction and two times of the width of the first portion in the second direction.

8. The 3D memory device of claim 1, wherein a distance between edges of adjacent two curved portions of the first plurality of curved portions or the second plurality of curved portions is between ⅙ of a width of the first portion in the second direction and three times of the width of the first portion in the second direction.

9. The 3D memory device of claim 1, wherein each of the first plurality of curved portions and the second plurality of curved portions has a same shape.

10. The 3D memory device of claim 1, wherein each of the first plurality of curved portions and the second plurality of curved portions has a shape of a partial of a circle.

11. The 3D memory device of claim 1, wherein each of the first plurality of curved portions and the second plurality of curved portions has a shape of a partial of an ellipse.

12. The 3D memory device of claim 1, further comprises a plurality of gate line slits intermittently extending along the first direction, wherein the plurality of gate line slits are located in a same memory block of the 3D memory device.

13. A method for forming a three-dimensional (3D) memory device, comprising:
    forming a stack structure, the stack structure comprising a core region and a staircase region;
    forming a channel structure extending through the stack structure in the core region; and
    forming a first support structure extending through the stack structure in the staircase region,
    wherein the first support structure has a bead-embedded strip shape in a plan view,
    wherein the bead-embedded strip shape is a shape comprising one elongated center strip shape extending along a first direction and embedded with a plurality of beads extending from a second direction at predetermined intervals along the elongated center strip shape,
    wherein a curvature of each of the plurality of beads contacts the elongated center strip shape, and
    wherein a plurality of seams are formed inside or on a surface of the first support structure along the first direction.

14. The method of claim 13, wherein forming the first support structure further comprises:
    forming an elongated trench through the stack structure in the staircase region, wherein the elongated trench comprises a plurality of curved portions protruding from two opposite sides of an elongated slit; and
    filling in the elongated trench with an insulation material to form the first support structure.

15. The method of claim 14, wherein the elongated trench is etched in places of the stack structure between adjacent two blocks of the 3D memory device.

16. The method of claim 13, further comprising:
    forming a second support structure, wherein the second support structure comprises a set of block shape support structures arranged in a two-dimensional array.

17. A system, comprising:
    a three-dimensional (3D) memory device configured to store data, the 3D memory device comprising:
        a stack structure comprising a core region and a staircase region,
        a channel extending through the stack structure in the core region, and
        a first support structure extending through the stack structure in the staircase region,
        wherein the first support structure has a bead-embedded strip shape in a plan view,
        wherein the bead-embedded strip shape is a shape comprising one elongated center strip shape extending along a first direction and embedded with a plurality of beads extending from a second direction at predetermined intervals along the elongated center strip shape,
        wherein a curvature of each of the plurality of beads contacts the elongated center strip shape, and
        wherein the first support structure is located between two blocks of the 3D memory device; and
    a memory controller coupled to the 3D memory device and configured to control the 3D memory device.

* * * * *